United States Patent
Chen et al.

(10) Patent No.: US 7,883,979 B2
(45) Date of Patent: Feb. 8, 2011

(54) METHOD FOR MANUFACTURING A SEMICONDUCTOR DEVICE WITH REDUCED FLOATING BODY EFFECT

(75) Inventors: Hung-Wei Chen, Hsinchu (TW); Zhong Tang Xuan, Kaohsiung (TW); Shui-Ming Cheng, Chubei (TW); Sheng-Da Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 373 days.

(21) Appl. No.: 10/973,966

(22) Filed: Oct. 26, 2004

(65) Prior Publication Data

US 2006/0086987 A1    Apr. 27, 2006

(51) Int. Cl.
    *H01L 21/336* (2006.01)

(52) U.S. Cl. .................. 438/300; 438/199; 438/933; 257/E21.093; 257/E21.431

(58) Field of Classification Search .............. 438/199, 438/224, 300, 933, 164; 257/351, 353, E21.092, 257/E21.093, E21.097, E21.103, E21.116, 257/E21.43, E21.431
See application file for complete search history.

(56) References Cited

U.S. PATENT DOCUMENTS

| 6,455,894 | B1 * | 9/2002 | Matsumoto et al. ......... 257/347 |
| 6,686,629 | B1 | 2/2004 | Assaderaghi et al. |
| 6,960,781 | B2 * | 11/2005 | Currie et al. ................. 257/19 |
| 2003/0098479 | A1 | 5/2003 | Murthy et al. |
| 2004/0173812 | A1 | 9/2004 | Currie et al. |

OTHER PUBLICATIONS

Quirk, M., & Serda, J. (2001). Semiconductor Manufacturing Technology, p. 214.*

* cited by examiner

*Primary Examiner*—Matthew C Landau
*Assistant Examiner*—Candice Y Chan
(74) *Attorney, Agent, or Firm*—Haynes and Boone, LLP

(57) ABSTRACT

A semiconductor device includes a substrate, a first device situated on the substrate, the first device including a source and a drain each situated extending a first depth within the substrate, and a second device situated on the substrate, the second device including a source and a drain each situated extending a second depth within the substrate, the second depth not equal to the first depth.

13 Claims, 26 Drawing Sheets

METHOD FOR MANUFACTURING A SEMICONDUCTOR DEVICE WITH REDUCED FLOATING BODY EFFECT

BACKGROUND

This disclosure relates generally to semiconductor manufacturing and more particularly to a method for manufacturing a semiconductor device with reduced floating body effect.

Silicon-On-Insulator (SOI) is the substrate choice in future generation integrated circuits. SOI typically consists of a silicon substrate with an insulator layer buried in it, with semiconductor devices built into a layer of silicon on top of the insulator layer. SOI provides improved performance due to reduced parasitic capacitances and enhanced isolation of devices.

However, the use of SOI can result in the floating body effect, where charge exists in the transistor body for extended periods of time, causing threshold voltages to vary. Several methods exist for reducing the floating body effect, including a Ge source/drain implant, an Ar implant, an In halo implant, and the use of a bipolar embedded source structure (BESS). However, the implanting of Ge, Ar, or In increases the junction leakage in the device, and the BESS is not a self aligning process.

Adopting a narrow bandgap material, such as SiGe alloy, is useful to reduce charges existing in the transistor body. With smaller bandgap due to the offset of the valence band, holes can flow out the transistor body more easily. SiGe source/drain is a well-known structure to provide uniaxial compressive stress to improve P-FET performance, as disclosed by INTEL. However, it is detrimental to the N-FET. Therefore, it is important to keep SiGe source/drain away from the channel surface of the N-FET.

Accordingly, it would be desirable to provide a method of manufacturing a semiconductor device with reduced floating body effect absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
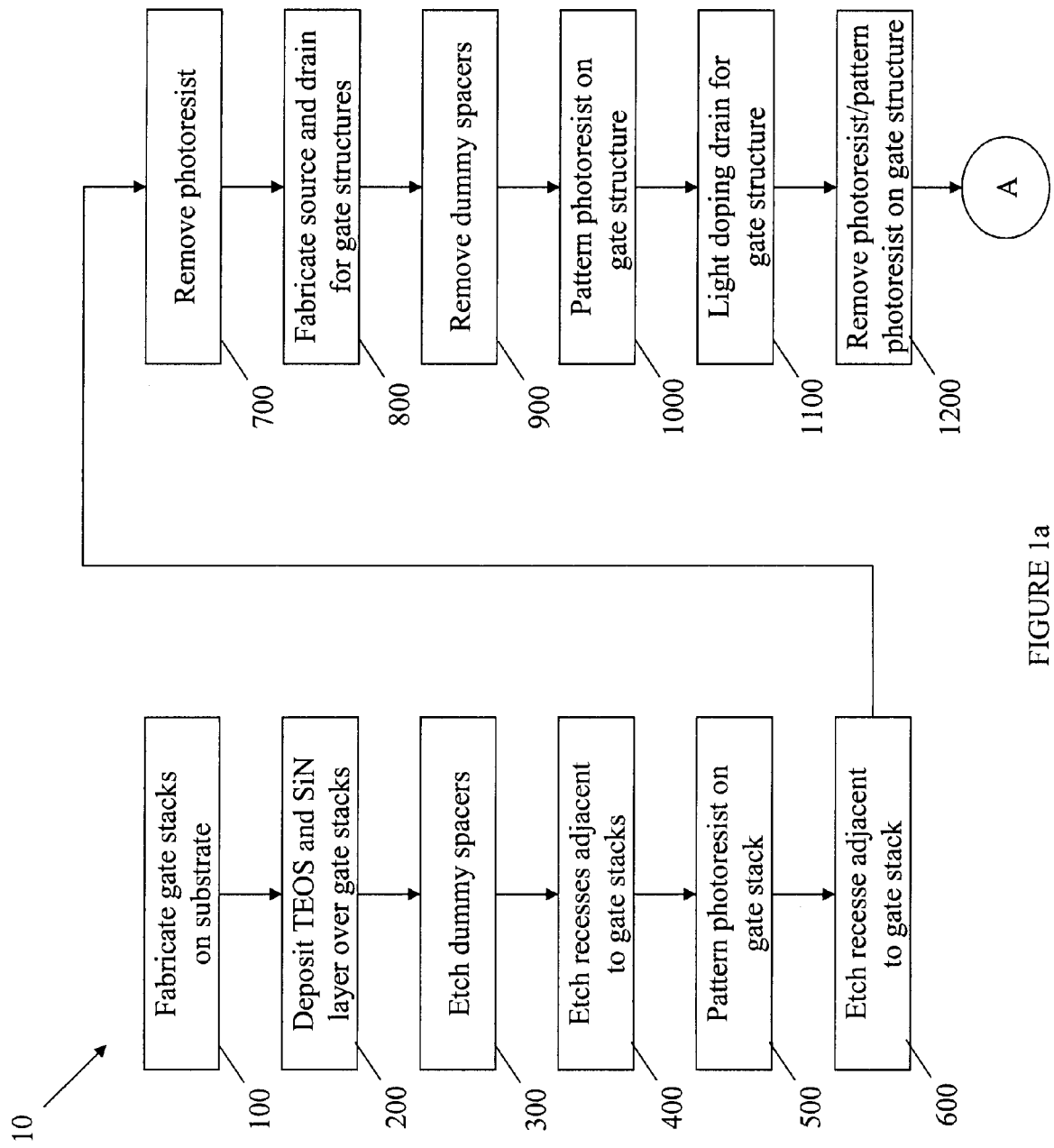
FIG. 1a is a flow chart illustrating an embodiment of a method for manufacturing a semiconductor device with reduced floating body effect.
Figure 1B:
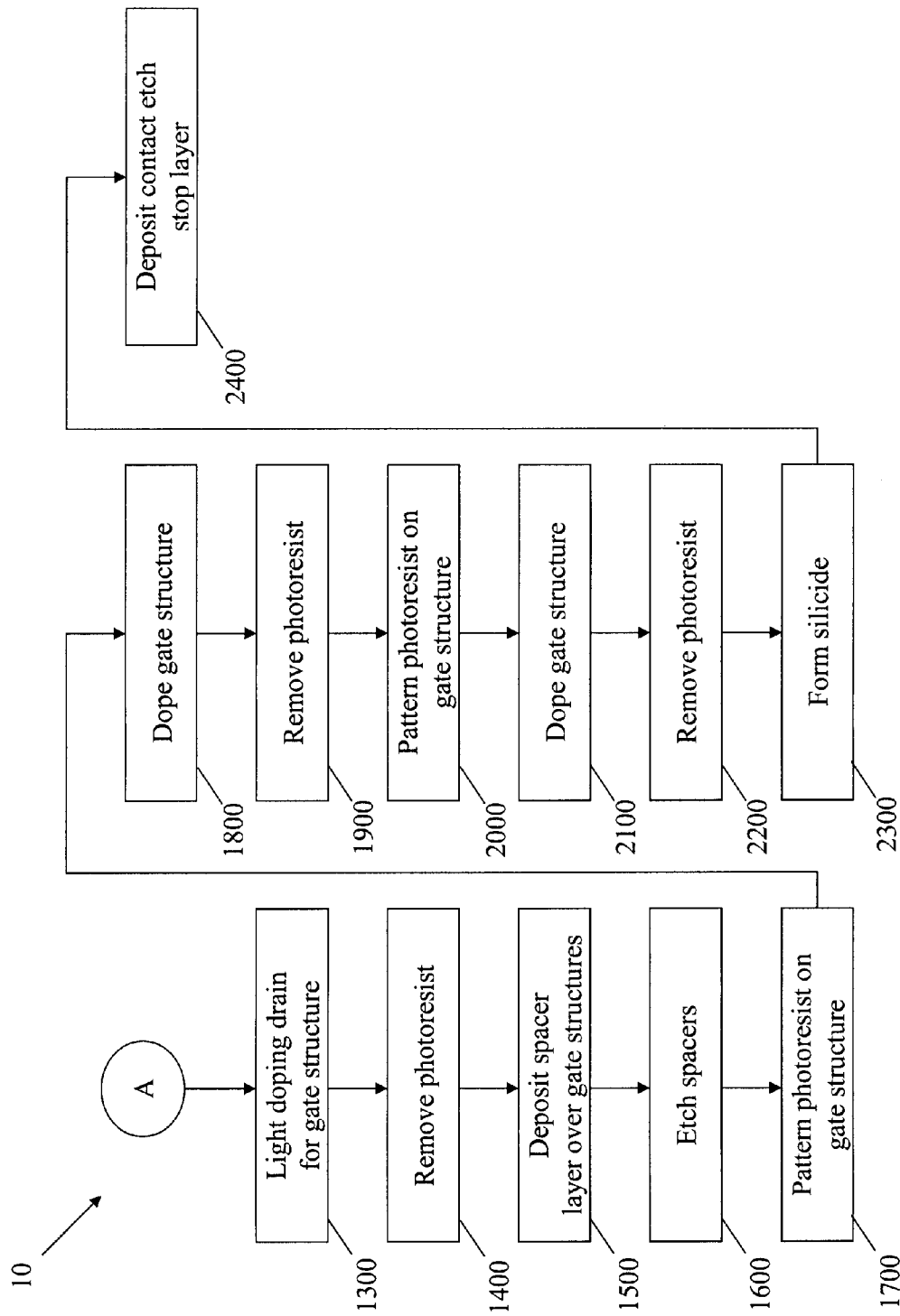
FIG. 1b is a flow chart illustrating an embodiment of a method for manufacturing a semiconductor device with reduced floating body effect.

Referring to FIGS. 1a and 1b, a method 10 for manufacturing a semiconductor device with reduced floating body effect is illustrated. The method 10 includes steps 100, 200, 300, 400, 500, 600, 700, 800, 900, 1000, 1100, 1200, 1300, 1400, 1500, 1600, 1700, 1800, 1900, 2000, 2100, 2200, 2300, and 2400, with each step explained in detail below.

Figure 2:
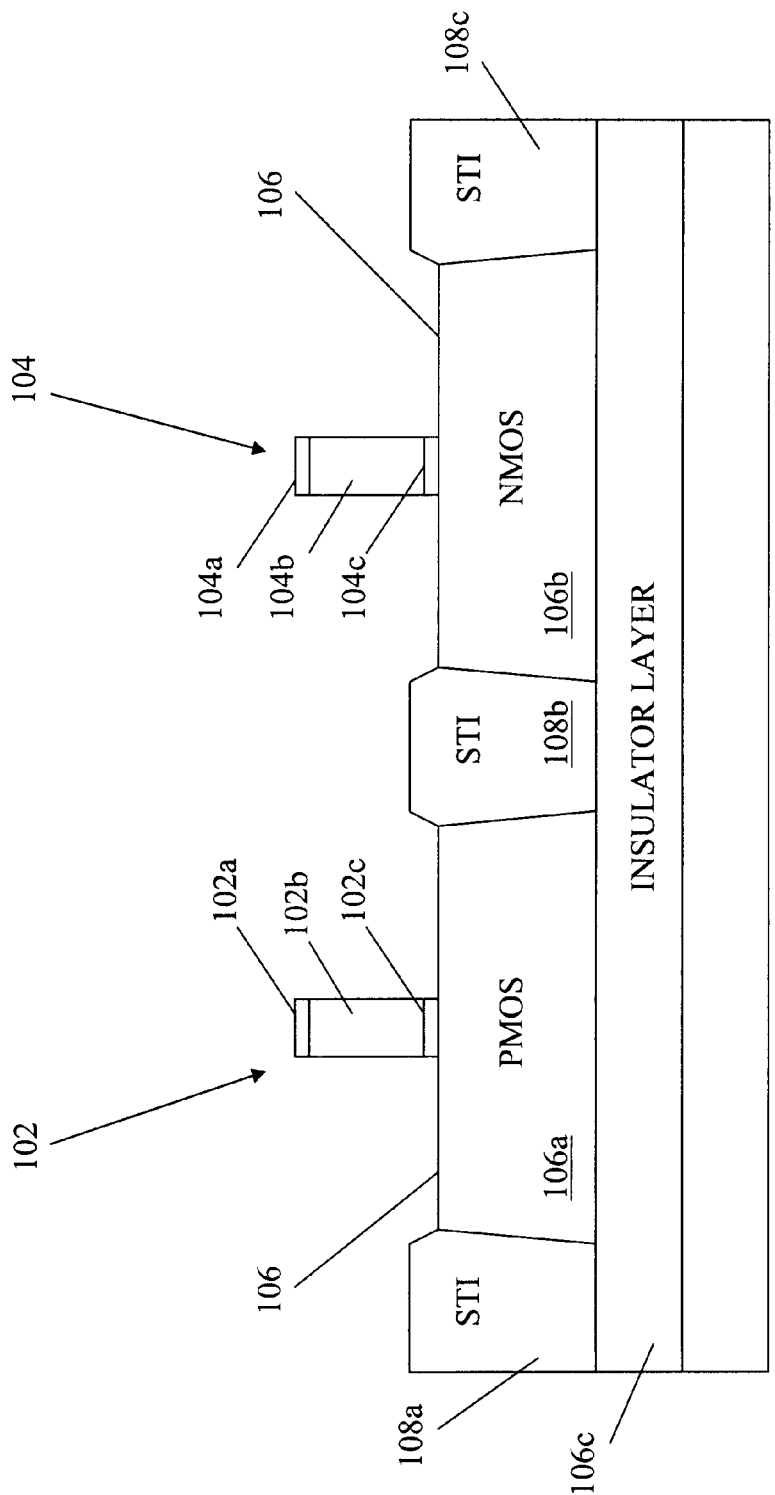
FIG. 2 is a cross sectional view illustrating an embodiment of a plurality of gate stacks fabricated on a substrate.

Referring now to FIGS. 1a and 2, the method 10 begins at step 100 where a plurality of gate stacks 102 and 104 are fabricated on a substrate 106. Gate stacks 102 and 104 may be fabricated using conventional methods known in the art. Gate stack 102 includes a hard mask 102a, a gate electrode 102b, and a gate dielectric 102c. In an exemplary embodiment, gate stack 102 is situated in a PMOS region 106a of the substrate 106. Gate stack 104 includes a hard mask 104a, a gate electrode 104b, and a gate dielectric 104c. In an exemplary embodiment, gate stack 104 is situated in an NMOS region 106b of the substrate 106. In an exemplary embodiment, the substrate 106 includes an insulator layer 106c and may be formed by, for example, a Silicon-On-Insulator (SOI) technology such as separation by implanted oxygen (SIMOX). In an exemplary embodiment, a plurality of shallow trench isolation structures 108a, 108b, and 108c are situated adjacent to and/or between the gate stacks 102 and 104. The gate dielectric 102c and 104c may include silicon oxide, silicon nitride, silicon oxynitride, high dielectric constant (k) materials, or combination thereof. The gate electrode 102b and 104b may include polysilicon, silicon nitride, metal, metal silicide, or combinations thereof. The hard mask 102a and 104a may include silicon nitride, silicon carbide, silicon dioxide or other suitable materials.

Figure 3:
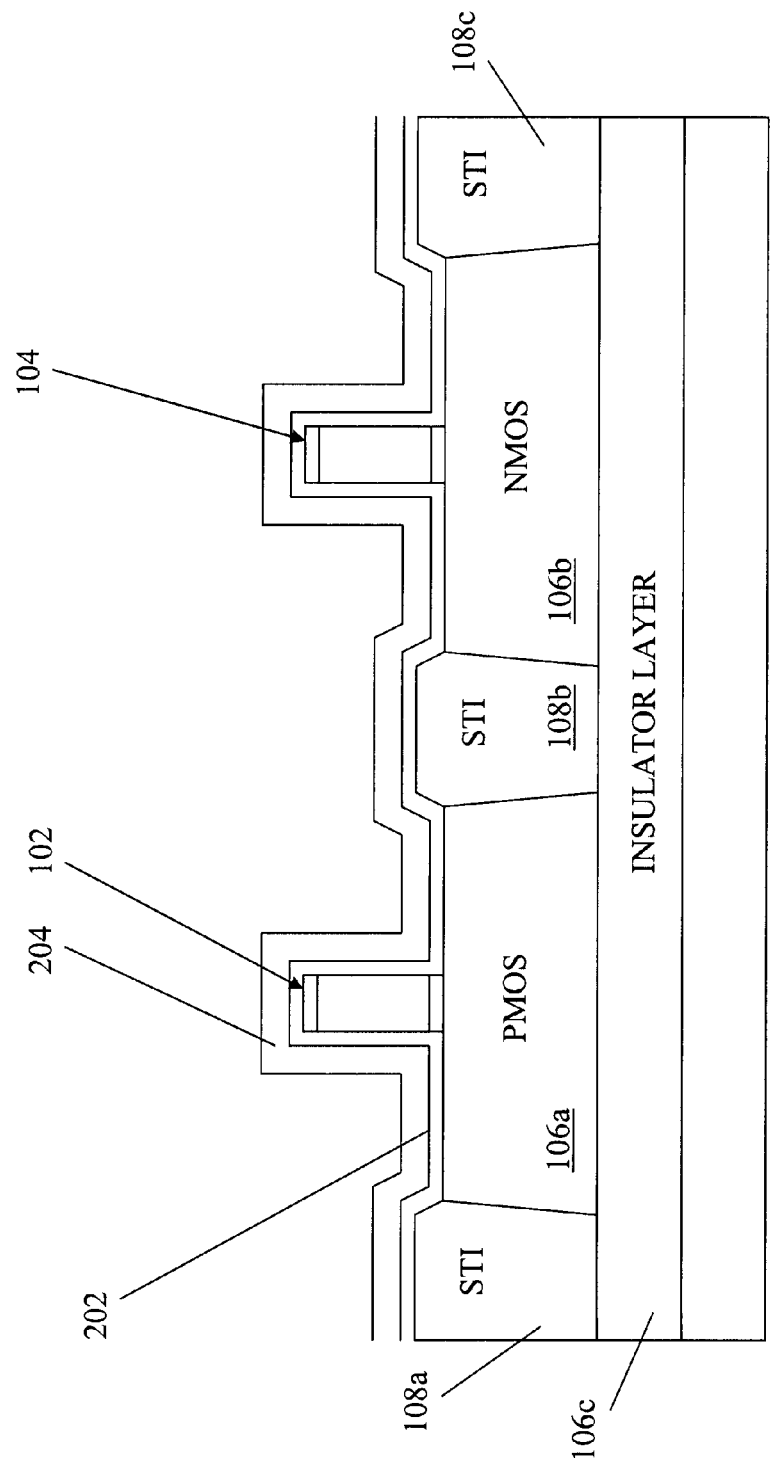
FIG. 3 is a cross sectional view illustrating an embodiment of a layer of SiN deposited over the gate stacks of FIG. 2.

Referring now to FIGS. 1a and 3, the method 10 proceeds to step 200 where a layer of Tetraethyl Orthosilicate (TEOS) 202 is deposited over the gate stacks 102 and 104, the substrate 106, and the shallow trench isolation structures 108a, 108b, and 108c. A layer of silicon nitride (SiN) 204 is then deposited over the layer of TEOS 202. Deposition of the layers of TEOS 202 and SiN 204 may be accomplished using conventional methods known in the art.

Figure 4:
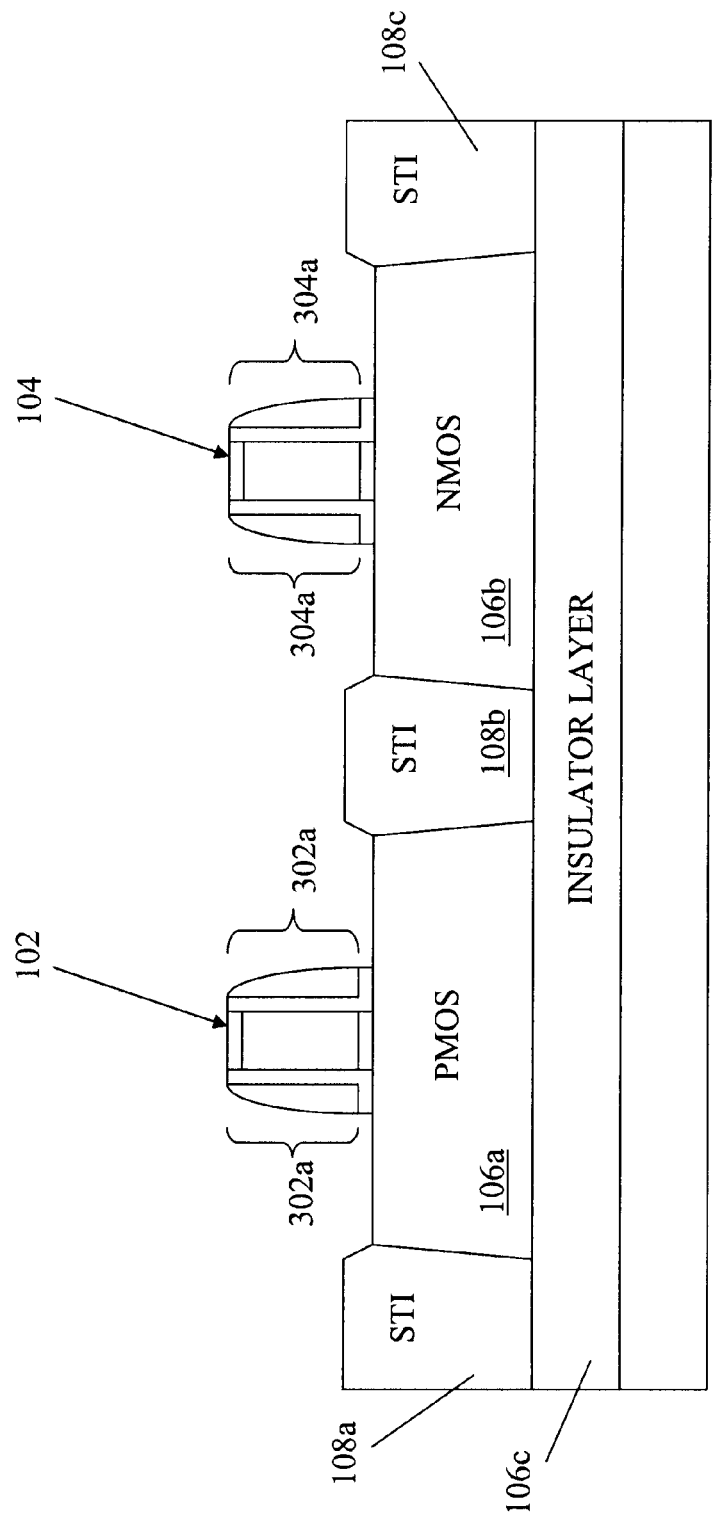
FIG. 4 is a cross sectional view illustrating an embodiment of a plurality of dummy spacers etched adjacent the gate stacks of FIG. 2.

Referring now to FIGS. 1a and 4, the method 10 proceeds to step 300 where a dummy spacer 302a is formed by anisotropically etching back from the deposited SiN 204, illustrated in FIG. 3, adjacent to gate stack 102, and a dummy spacer 304a is formed by anisotropically etching back from the deposited SiN 204, illustrated in FIG. 3, adjacent to gate stack 104.

Figure 5:
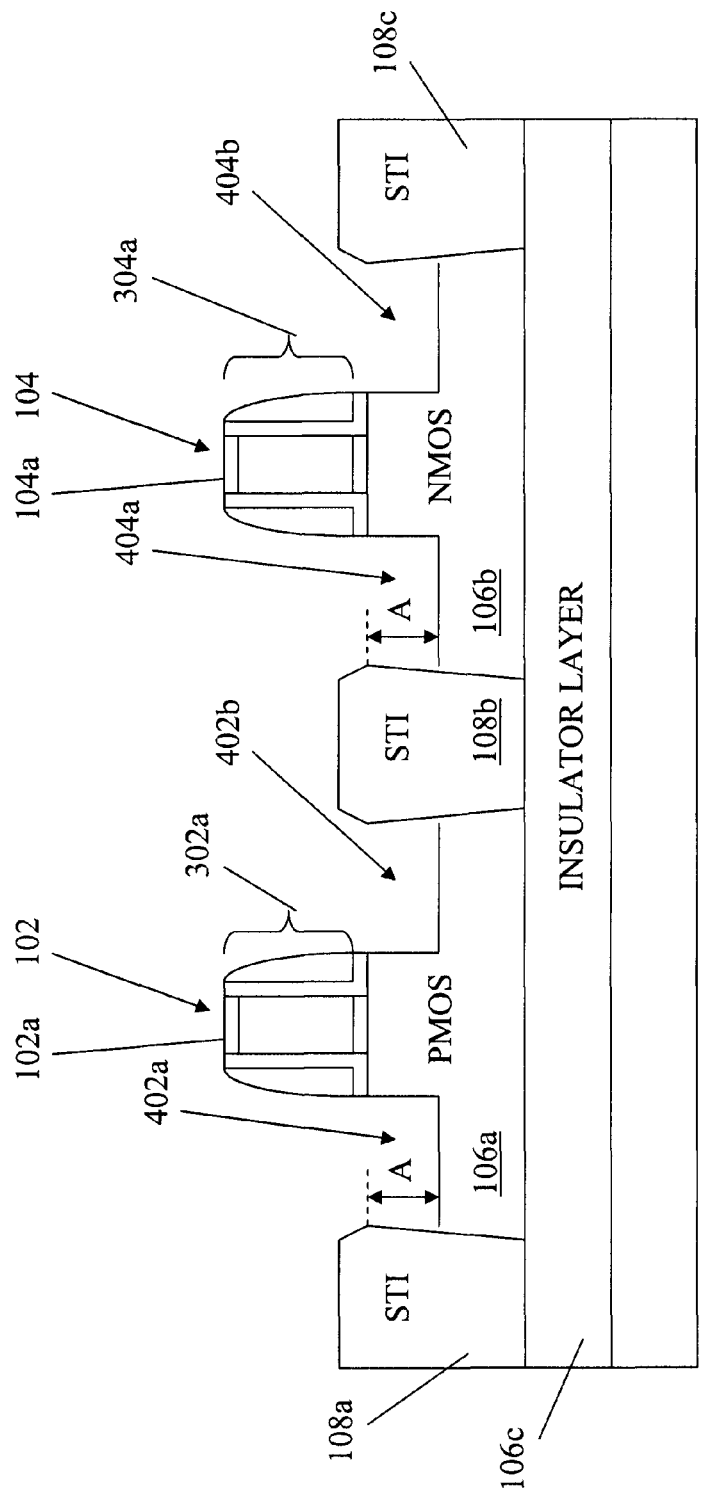
FIG. 5 is a cross sectional view illustrating an embodiment of a plurality of recesses etched adjacent to the gate stacks of FIG. 4.

Referring now to FIGS. 1a and 5, the method 10 proceeds to step 400 where a recess 402a and a recess 402b are etched to a depth A into the substrate surface, adjacent to the gate stack 102. In an exemplary embodiment, recess 402a is etched from between the shallow trench isolation structure 108a and the dummy spacer 302a, and the recess 402b is etched from between shallow trench isolation structure 108b and the dummy spacer 302a. A recess 404a and a recess 404b are also etched to the depth A adjacent to gate stack 104. In an exemplary embodiment, the recess 404a is etched from between the shallow trench isolation structures 108b and the dummy spacer 304a, and the recess 404b is etched from between the shallow trench isolation structure 108c and the dummy spacer 304a.

Figure 6:
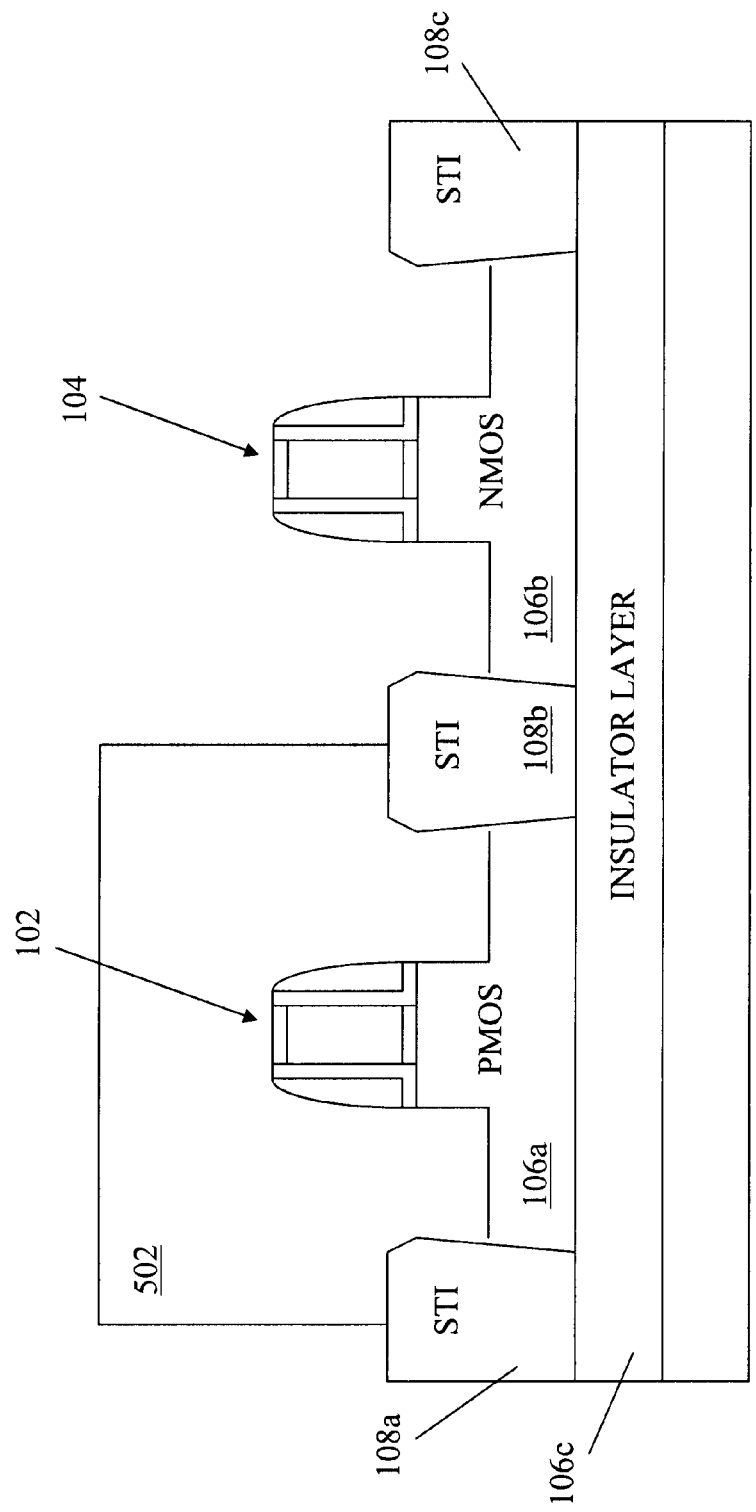
FIG. 6 is a cross sectional view illustrating an embodiment of a layer of photoresist patterned over one of the gate stacks of FIG. 5.

Referring now to FIGS. 1a and 6, the method 10 proceeds to step 500 where a layer of photoresist 502 is applied and patterned on gate stack 102. In an exemplary embodiment, photoresist patterning is accomplished using methods known in the art and includes processing steps such as photoresist coating, softbaking, mask aligning, pattern exposing, developing, and hard baking. In an exemplary embodiment, the layer of photoresist 502 is patterned such that it is situated between the shallow trench isolation structures 108a and 108b and over the PMOS region 106a and the gate stack 102.

Figure 7:
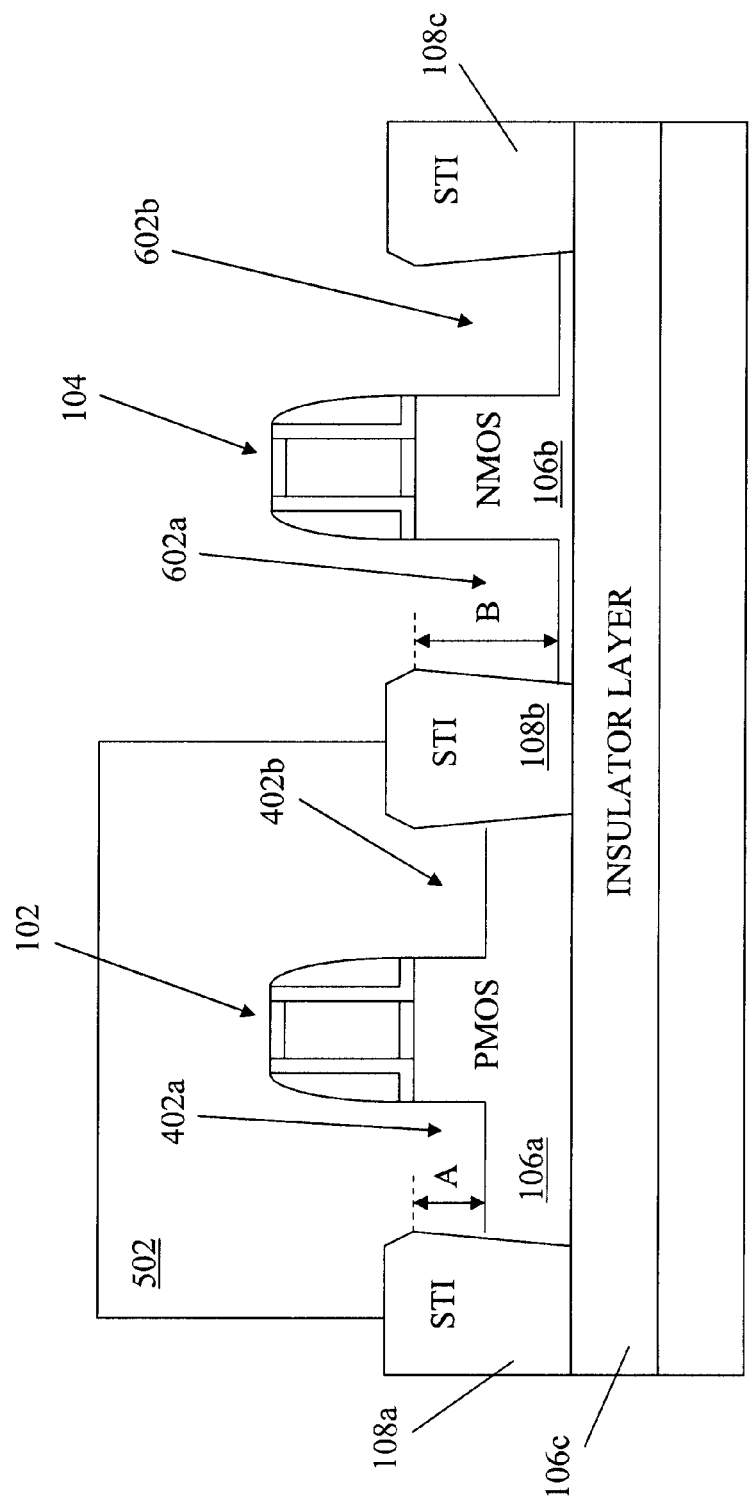
FIG. 7 is a cross sectional view illustrating an embodiment of a recess etched adjacent to one of the gate stacks of FIG. 6.
Figure 8:
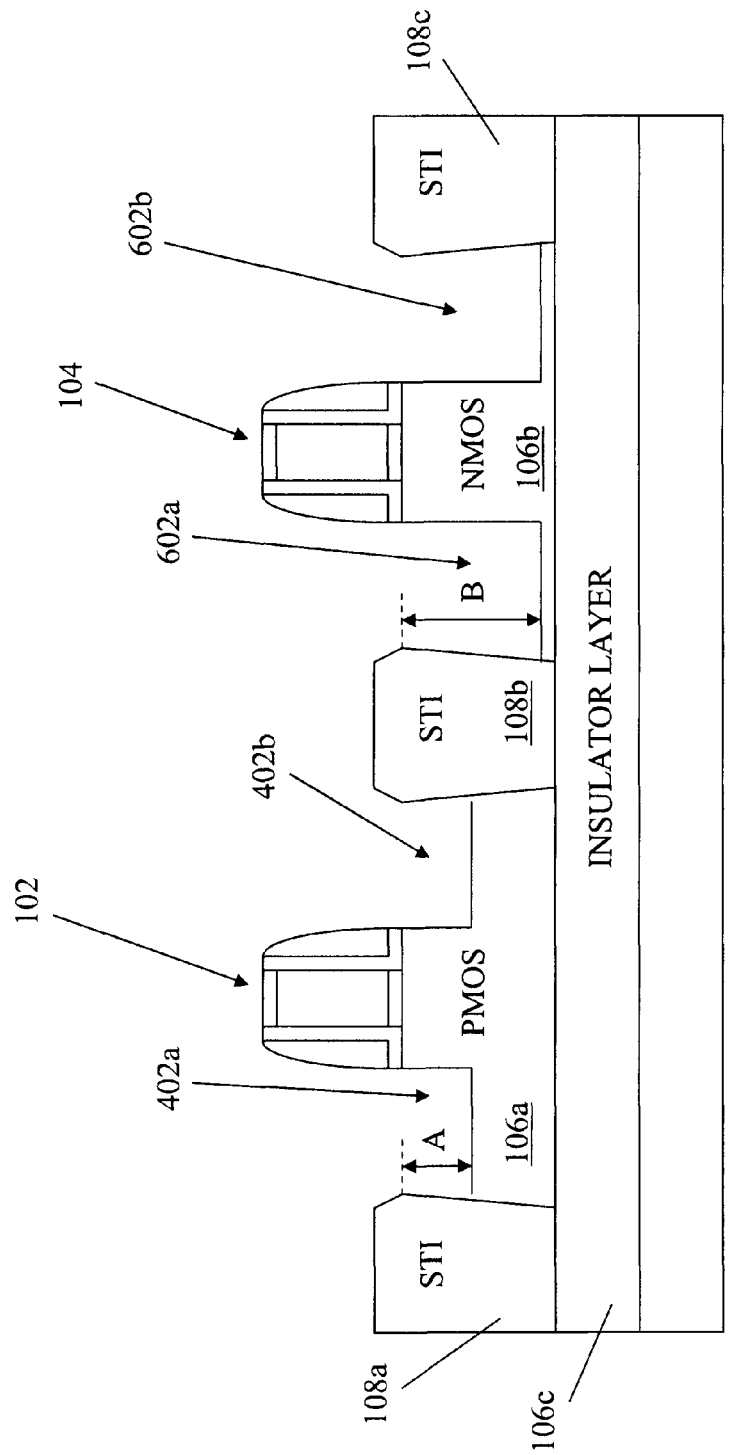
FIG. 8 is a cross sectional view illustrating an embodiment of the layer of photoresist removed from the gate stack of FIG. 7.

Referring now to FIGS. 1a, 7, and 8, the method proceeds to step 600 where recesses 404a and 404b, illustrated in FIG. 5, adjacent to gate stack 104 are further etched to a depth B to form a recess 602a and a recess 602b adjacent gate stack 104. Depth B of recess 602a and 602b is greater than depth A of recess 402a and 402b. An example depth for depth A of recess 402a and 402b is about 50 to 1000 Å, and an example depth for depth B of recess 602a and 602b is about 100 to 1500 Å. The layer of photoresist 502 is then removed in step 700 to expose gate stack 102 and PMOS region 106a.

Figure 9:
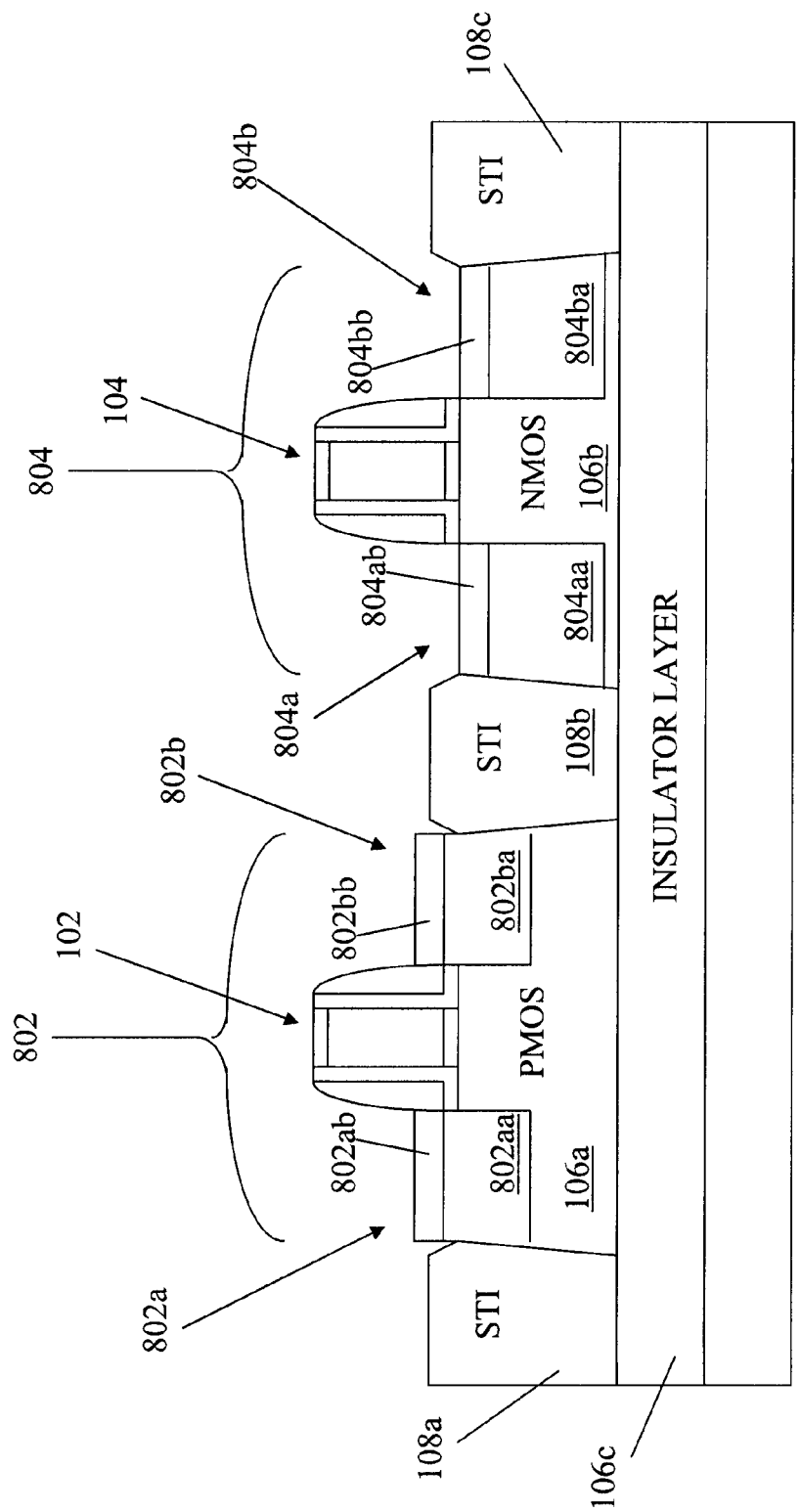
FIG. 9 is a cross sectional view illustrating an embodiment of a plurality of devices fabricated by forming a plurality of source/drain regions in the recesses adjacent the gate stacks of FIG. 8.

Referring now to FIGS. 1a and 9, the method proceeds to step 800 where a device 802 is created by fabricating a source/drain region 802a and 802b on opposite sides of the gate stack 102. In an exemplary embodiment, source/drain region 802a is fabricated by forming a SiGe alloy layer 802aa in the recess 402a, illustrated in FIG. 8, and forming a Si cap layer 802ab on top of the SiGe alloy layer 802aa. In an exemplary embodiment, source/drain region 802b is fabricated by forming a SiGe alloy layer 802ba in the recess 402b, illustrated in FIG. 8, and forming a Si cap layer 802bb on top of the SiGe alloy layer 802ba. In an exemplary embodiment, the device 802 includes the gate stack 102, the source/drain regions 802a and 802b, and the PMOS region 106a of the substrate 106. A device 804 is also created by fabricating a source/drain region 804a and 804b on opposite sides of the gate stack 104. In an exemplary embodiment, source/drain region 804a is fabricated by forming a SiGe alloy layer 804aa in the recess 602a, illustrated in FIG. 8, and forming a Si cap layer 804ab on top of the SiGe alloy layer 804aa. In an exemplary embodiment, source/drain region 804b is fabricated by forming a SiGe alloy layer 804ba in the recess 602b, illustrated in FIG. 8, and forming a Si cap layer 804bb on top of the SiGe alloy layer 804ba. In an exemplary embodiment, the device 804 includes the gate stack 104, the source/drain regions 804a and 804b, and the NMOS region 106b of the substrate 106. In an exemplary embodiment, the SiGE alloy layers 802aa, 802ba, 804aa, and 804ba may be formed using a selective epitaxial growth (SEG) method, which includes using hydrochloride (HCl) and germane (GeH$_4$) under defined parameters, the parameters which may include temperatures ranging between 400 C and 900 C, HCl gas flows ranging between 15 sccm and 2000 sccm, GeH$_4$ gas flows ranging between 20 sccm and 200 sccm, and pressures ranging between 10 torr and 250 torr. In an exemplary embodiment, the Si cap layers 802ab, 802bb, 804ab, and 804bb may also be formed using an SEG method, which includes using HCl and dichlorosilane (DCS) under defined parameters, the parameters which may include temperatures ranging between 500 C and 1100 C, HCl gas flows ranging between 15 sccm and 200 sccm, DCS gas flows ranging between 10 sccm and 300 sccm, and pressures ranging between 10 torr and 250 torr.

Figure 10:
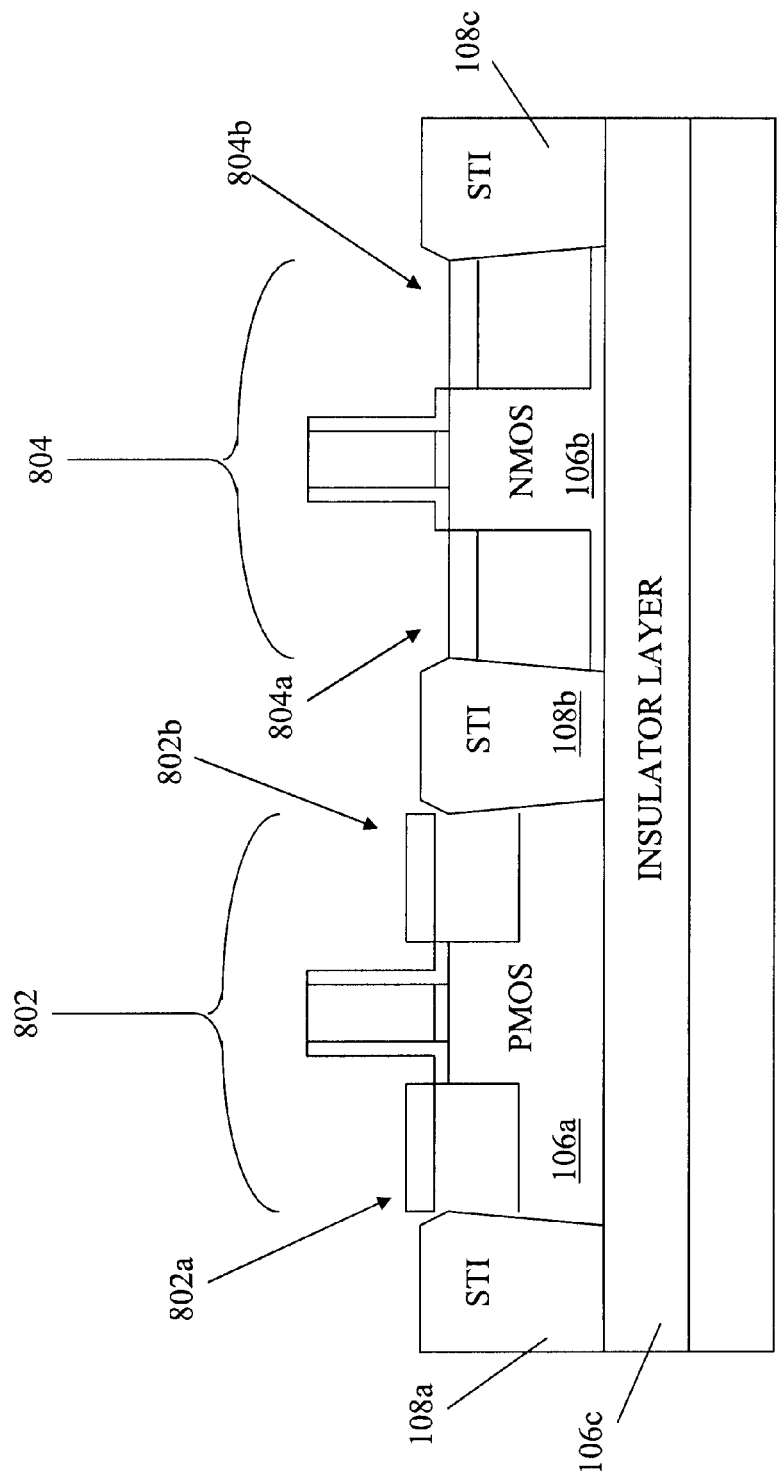
FIG. 10 is a cross sectional view illustrating an embodiment of the dummy gates removed from the devices of FIG. 9.

Referring now to FIGS. 1a and 10, the method proceeds to step 900 where the dummy spacer 302a adjacent gate stack 102, illustrated in FIG. 4, the dummy spacer 304a adjacent gate stack 104, illustrated in FIG. 4, and the hard masks 102a and 104a on gate stacks 102 and 104, respectively, are removed. In an exemplary embodiment, the dummy spacers 302a and 304a and the hard masks 102a and 104a may be removed by applying a phosphoric acid solution.

Figure 11:
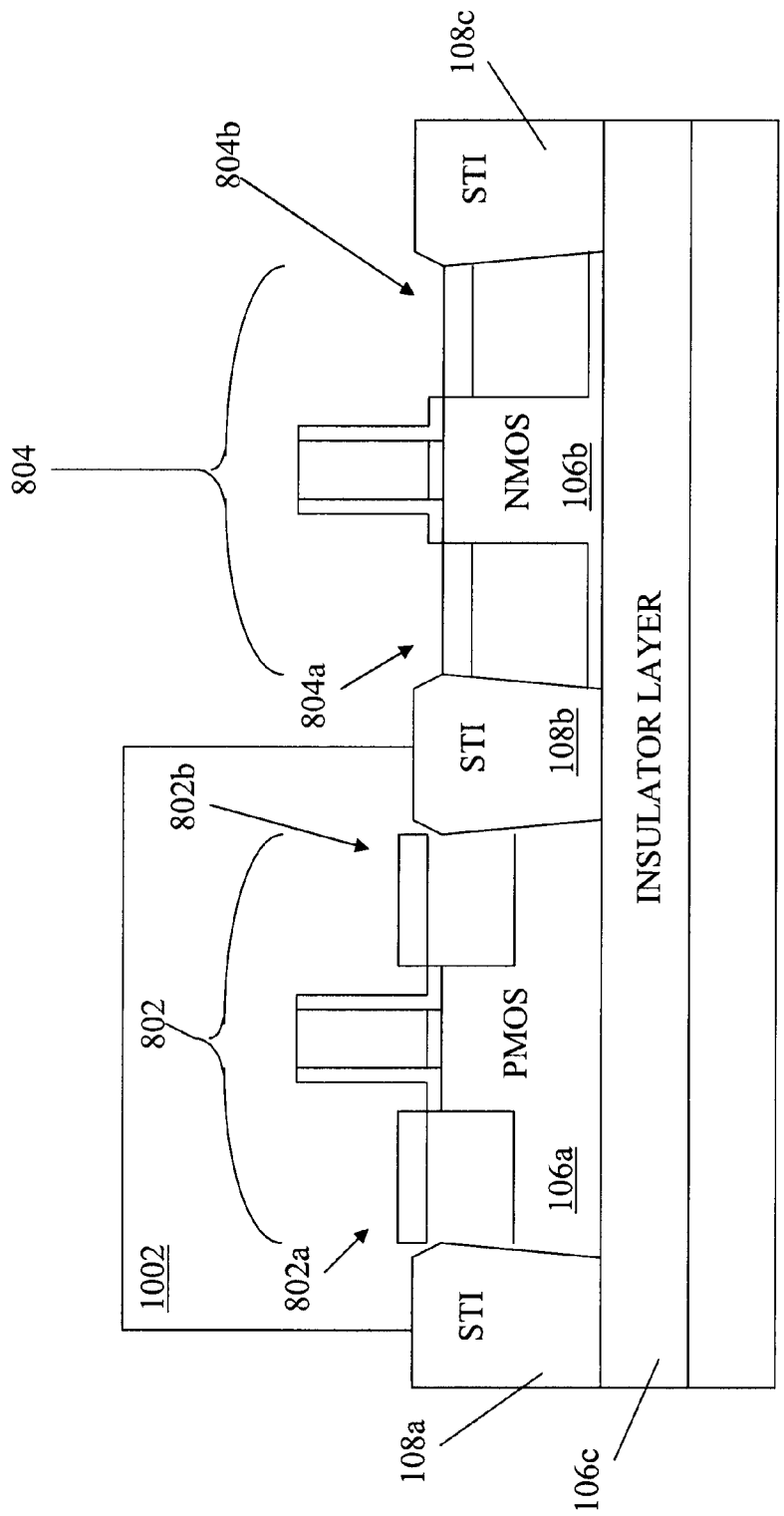
FIG. 11 is a cross sectional view illustrating an embodiment of a layer of photoresist patterened on one of the devices of FIG. 10.

Referring now to FIGS. 1a and 11, the method proceeds to step 1000 where a layer of photoresist 1002 is applied and patterned on device 802. In an exemplary embodiment, the layer of photoresist 1002 is patterned such that it is situated between the shallow trench isolation structures 108a and 108b and over the device 802.

Figure 12:
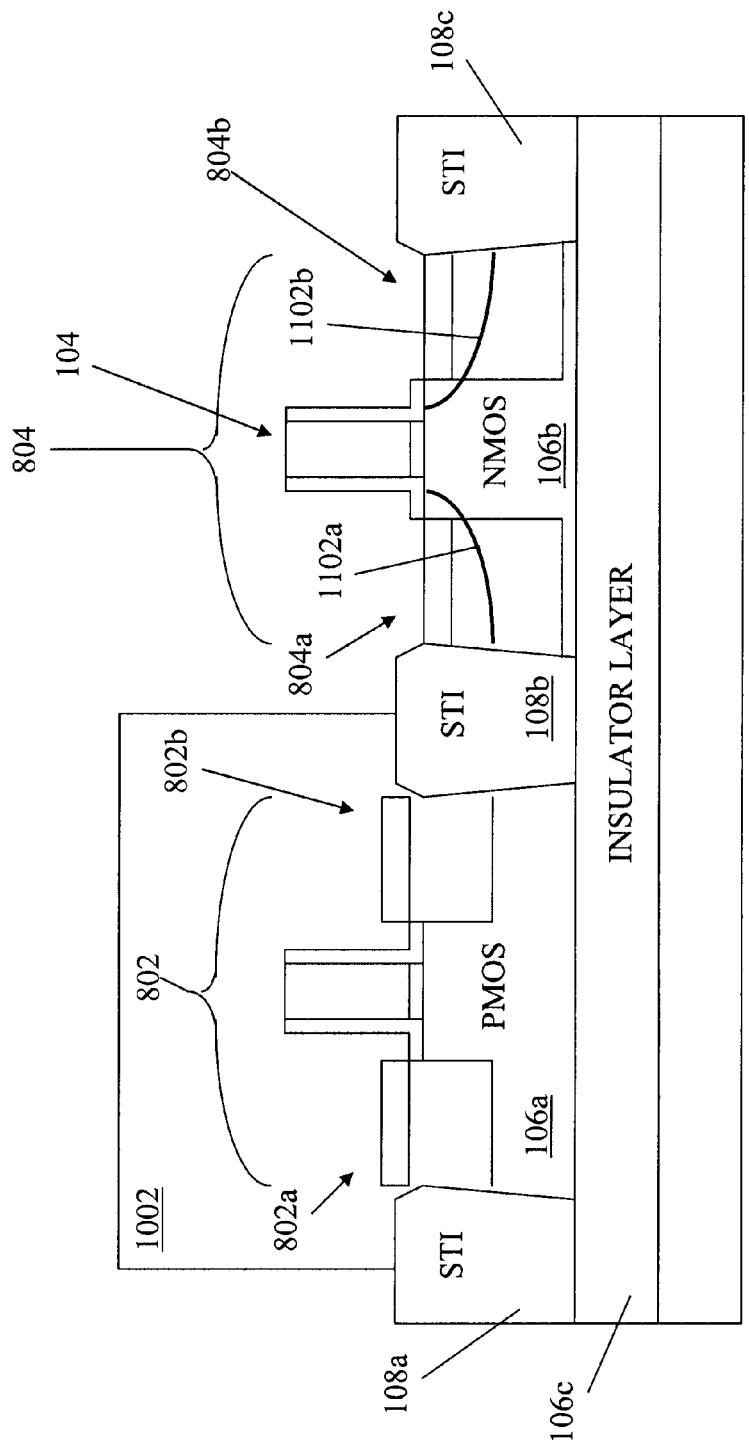
FIG. 12 is a cross sectional view illustrating an embodiment of a light doping drain implanted in the source/drain regions of one of the devices of FIG. 11.

Referring now to FIGS. 1a and 12, the method proceeds to step 1100 where a light doping drain 1102a is implanted in the source/drain region 804a of device 804 and a light doping drain 1102b is implanted in the source/drain region 804b of device 804. In an exemplary embodiment, the light doping drain 1102a is implanted in the source/drain region 804a, beginning offset from gate stack 104 and ending at the shallow trench isolation structure 108b. In an exemplary embodiment, the light doping drain 1102b is implanted in the source/ drain region 804*b*, beginning offset from gate stack 104 and ending at the shallow trench isolation structure 108*c*. In an exemplary embodiment, the doping type may be n-type, such as phosphorus and arsenic, for the NMOS region 106*b*, or p-type, such as boron, BF$_2$, or B—F co-implant for the PMOS region 106*a*.

Figure 13:
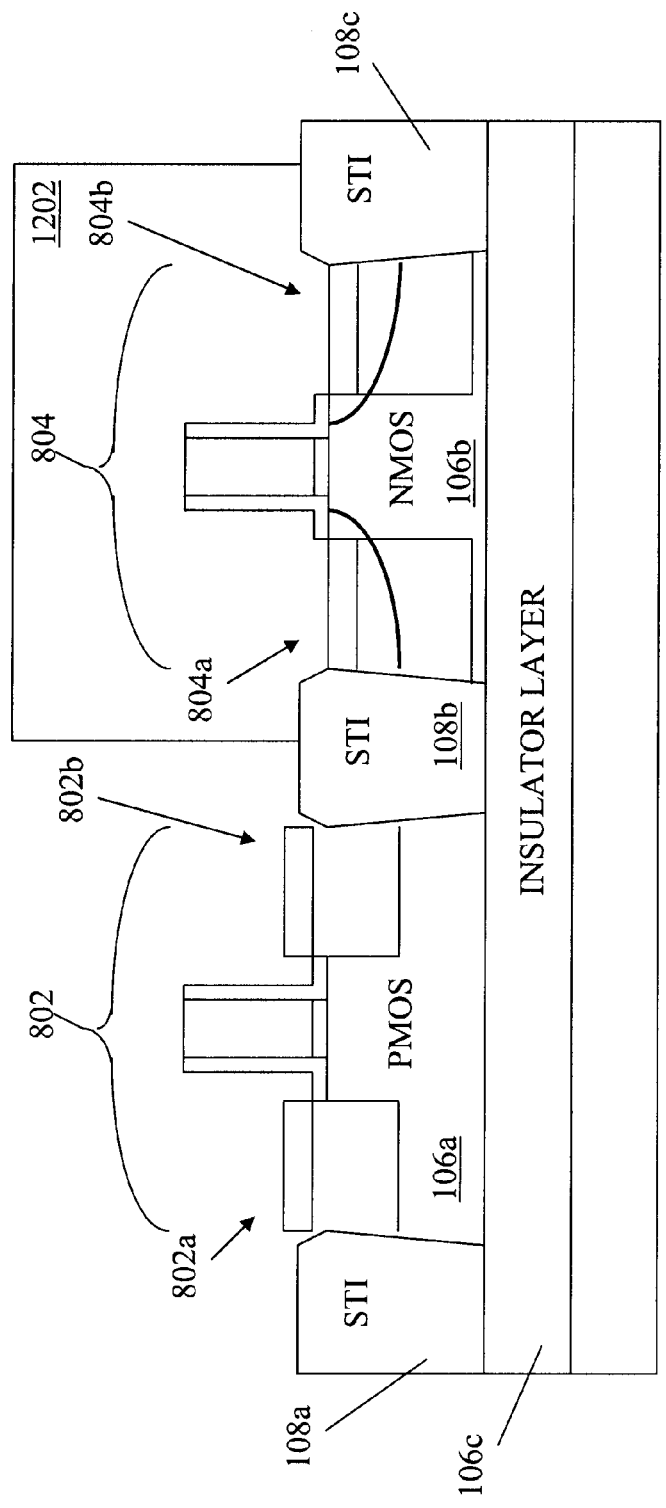
FIG. 13 is a cross sectional view illustrating an embodiment of the layer of photoresist removed from the device of FIG. 12 and a layer of photoresist patterned on the other device of FIG. 12.

Referring now to FIGS. 1*a* and 13, the method proceeds to step 1200 where the photoresist 1002, illustrated in FIGS. 11 and 12, is removed from over device 802 and a layer of photoresist 1202 is applied and patterned on device 804. In an exemplary embodiment, the layer of photoresist 1202 is patterned such that it is situated between the shallow trench isolation structures 108*b* and 108*c* and over the device 804.

Figure 14:
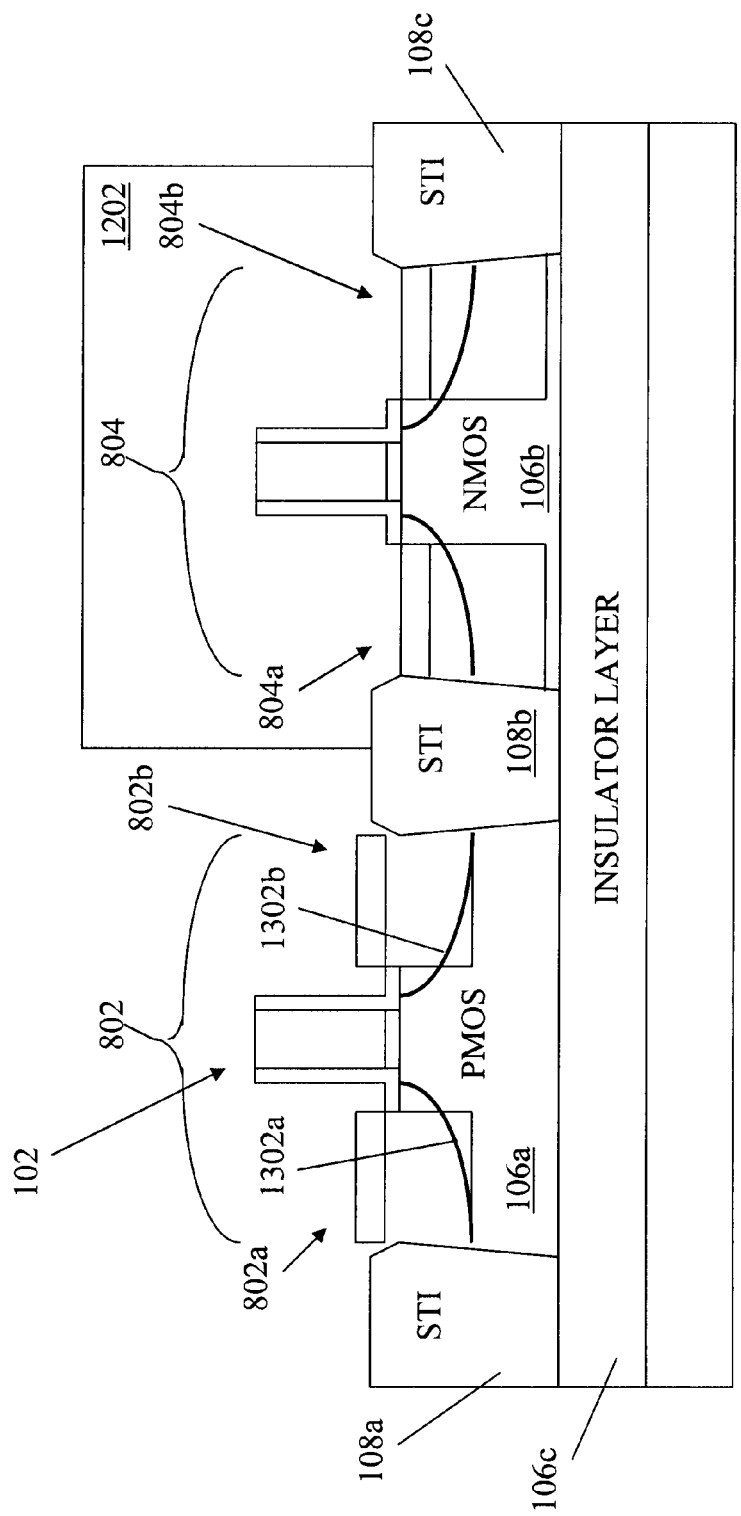
FIG. 14 is a cross sectional view illustrating an embodiment of a light doping drain implanted in the source/drain regions of one of the devices of FIG. 13.
Figure 15:
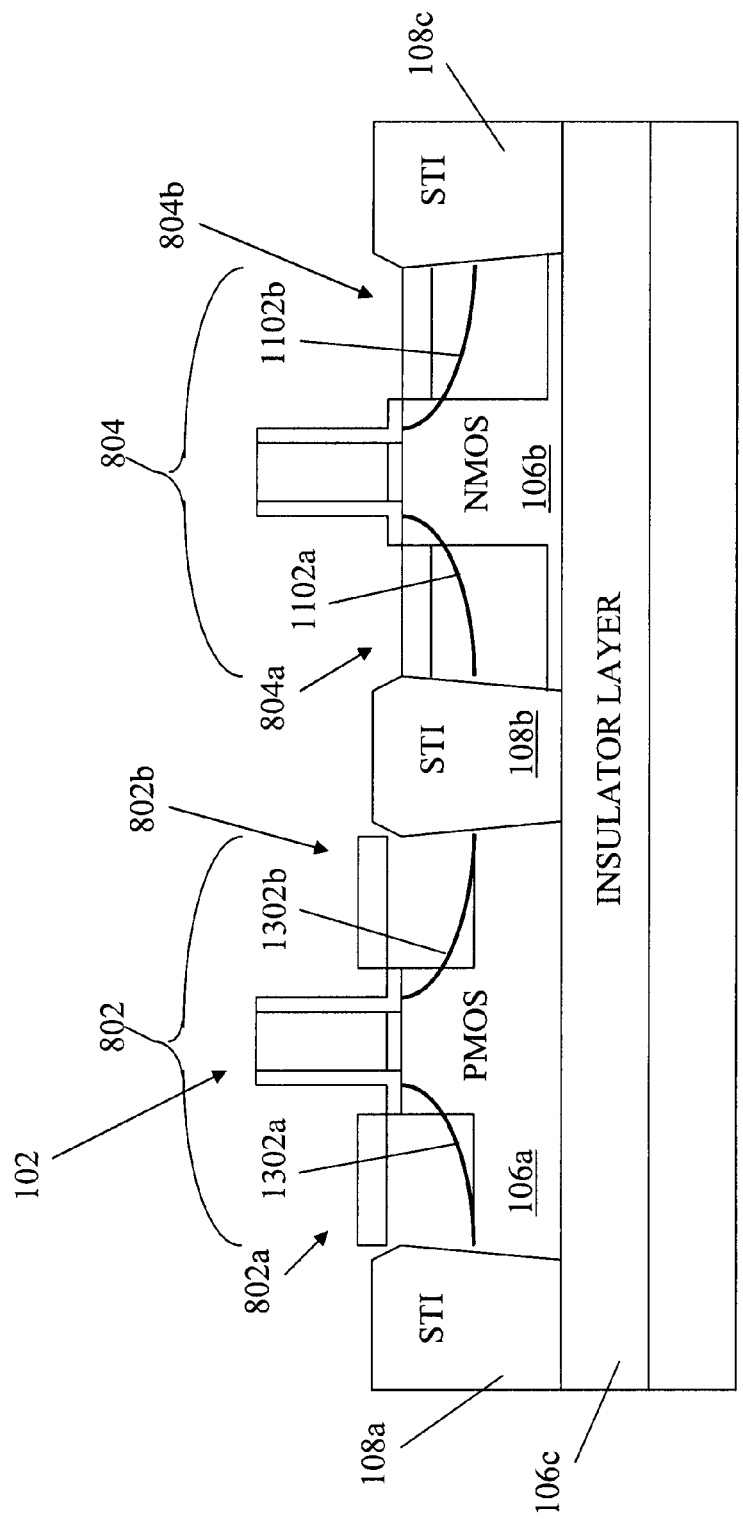
FIG. 15 is a cross sectional view illustrating an embodiment of the layer of photoresist removed from the device of FIG. 14.

Referring now to FIGS. 1*b*, 14, and 15 the method proceeds to step 1300 where a light doping drain 1302*a* is implanted in the source/drain region 802*a* of device 802 and a light doping drain 1302*b* is implanted in the source/drain region 802*b* of device 802. In an exemplary embodiment, the light doping drain 1302*a* is implanted in the source/drain region 802*a*, beginning offset from gate stack 102 and ending at the shallow trench isolation structure 108*a*. In an exemplary embodiment, the light doping drain 1302*b* is implanted in the source/drain region 802*b*, beginning offset from gate stack 102 and ending at the shallow trench isolation structure 108*b*. At step 1400, the photoresist 1202 is removed from over device 804.

Figure 16:
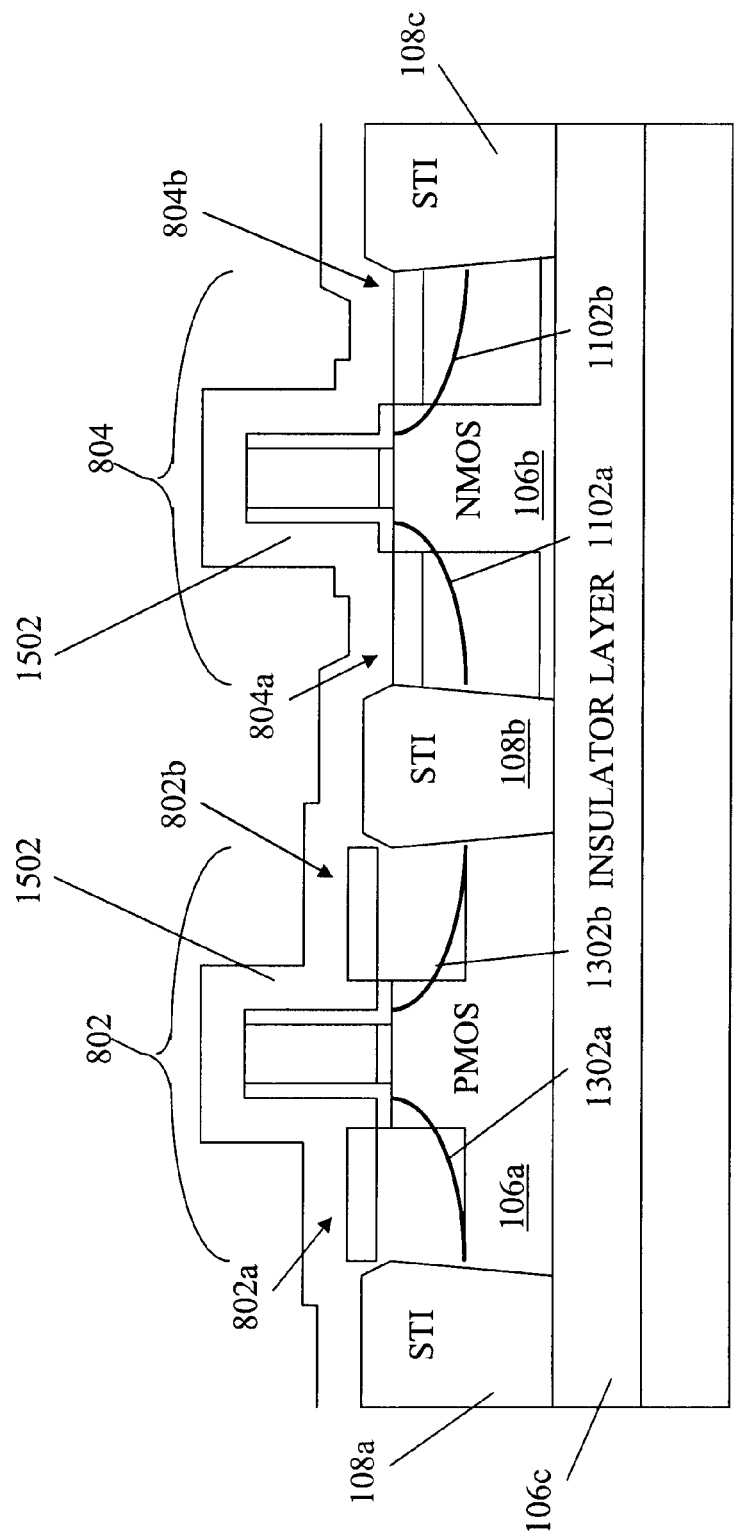
FIG. 16 is a cross sectional view illustrating an embodiment of a spacer layer deposited on the devices of FIG. 15.

Referring now to FIGS. 1*b* and 16, the method proceeds to step 1500 where a layer 1502 is deposited over device 802 and device 804. In an exemplary embodiment, the layer 1502 may include a Tetraethyl Orthosilicate (TEOS) layer and a SiN layer.

Figure 17:
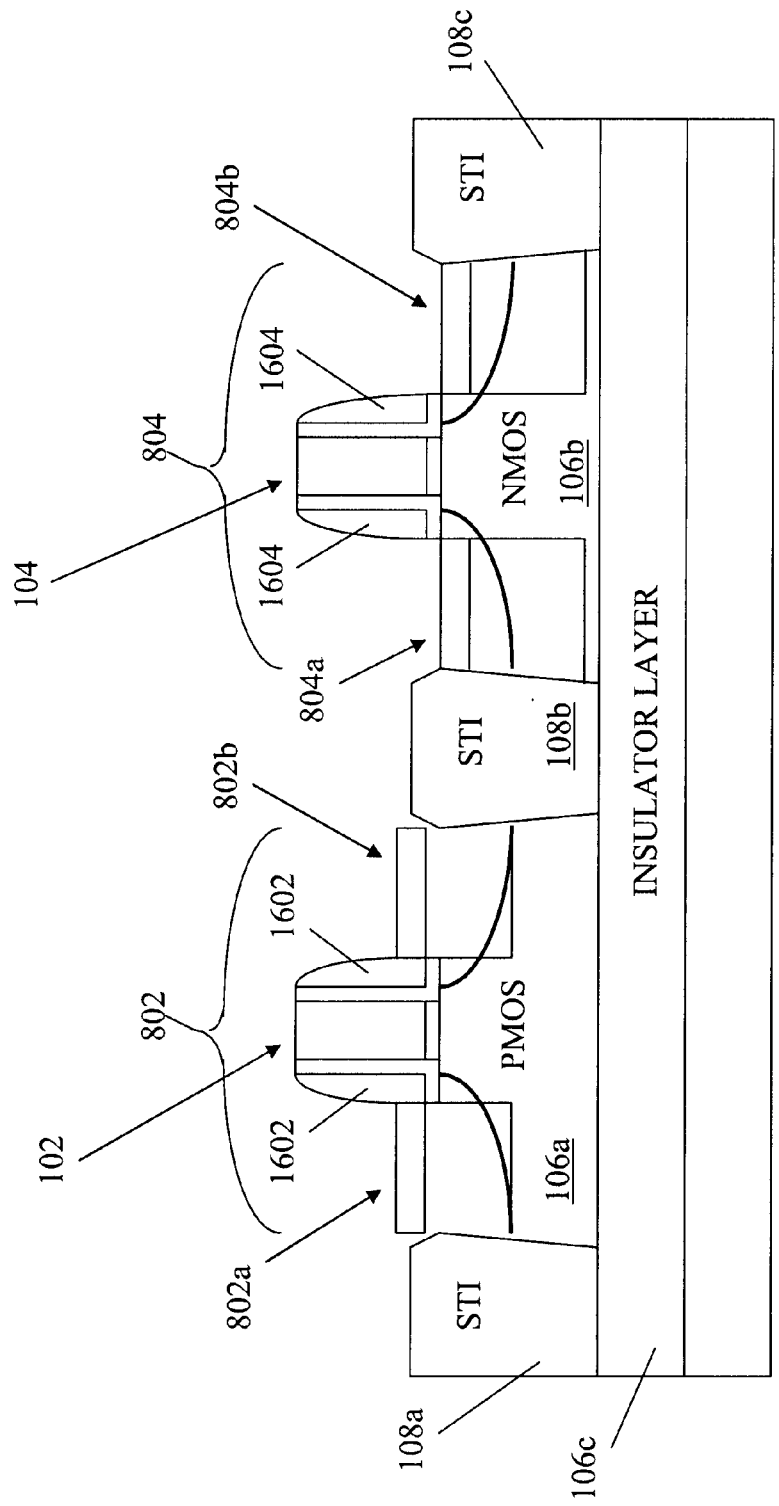
FIG. 17 is a cross sectional view illustrating an embodiment of a plurality of spacers formed on the devices of FIG. 16.

Referring now to FIGS. 1*b* and 17, the method proceeds to step 1600 where a spacer 1602 is etched from the layer 1502, illustrated in FIG. 16, adjacent to gate stack 102 in device 802. A spacer 1604 is etched from the layer 1502, illustrated in FIG. 16, adjacent to gate stack 104 in device 804.

Figure 18:
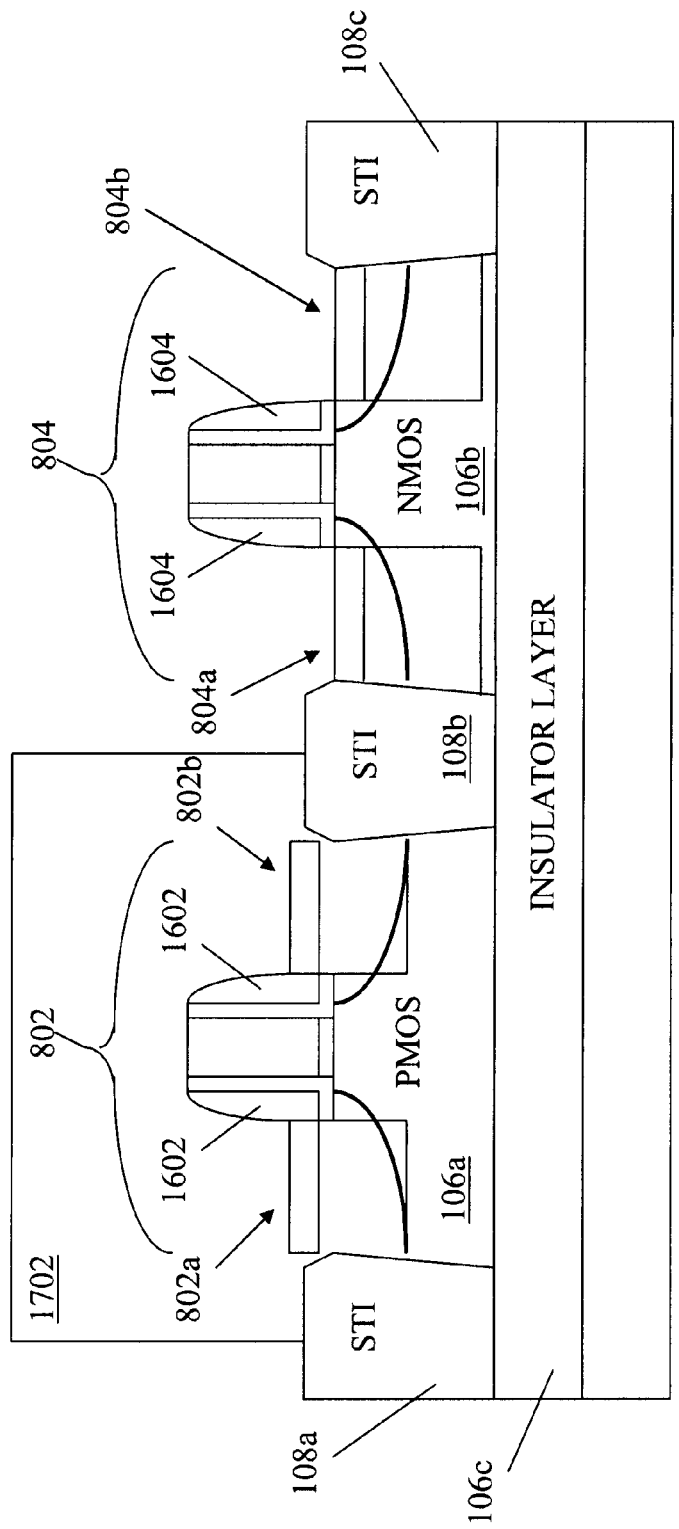
FIG. 18 is a cross sectional view illustrating an embodiment of a layer of photoresist patterned on one of the devices of FIG. 17.

Referring now to FIGS. 1*b* and 18, the method proceeds to step 1700 where a layer of photoresist 1702 is applied and patterned on device 802. In an exemplary embodiment, the layer of photoresist 1702 is patterned such that it is situated between the shallow trench isolation structures 108*a* and 108*b* and over the device 802.

Figure 19:
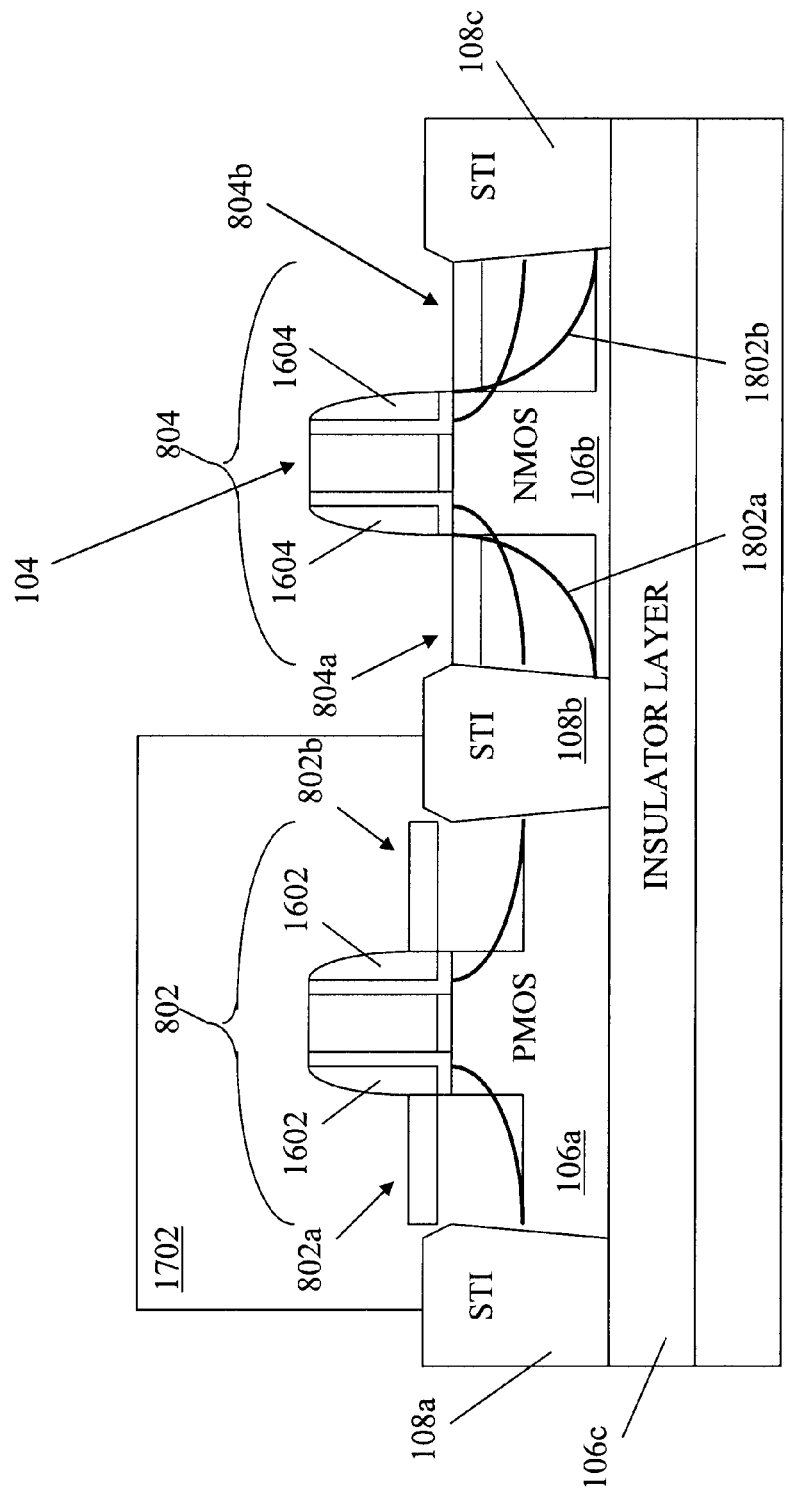
FIG. 19 is a cross sectional view illustrating an embodiment of a dopant implanted in the source/drain regions of one of the devices of FIG. 18.
Figure 20:
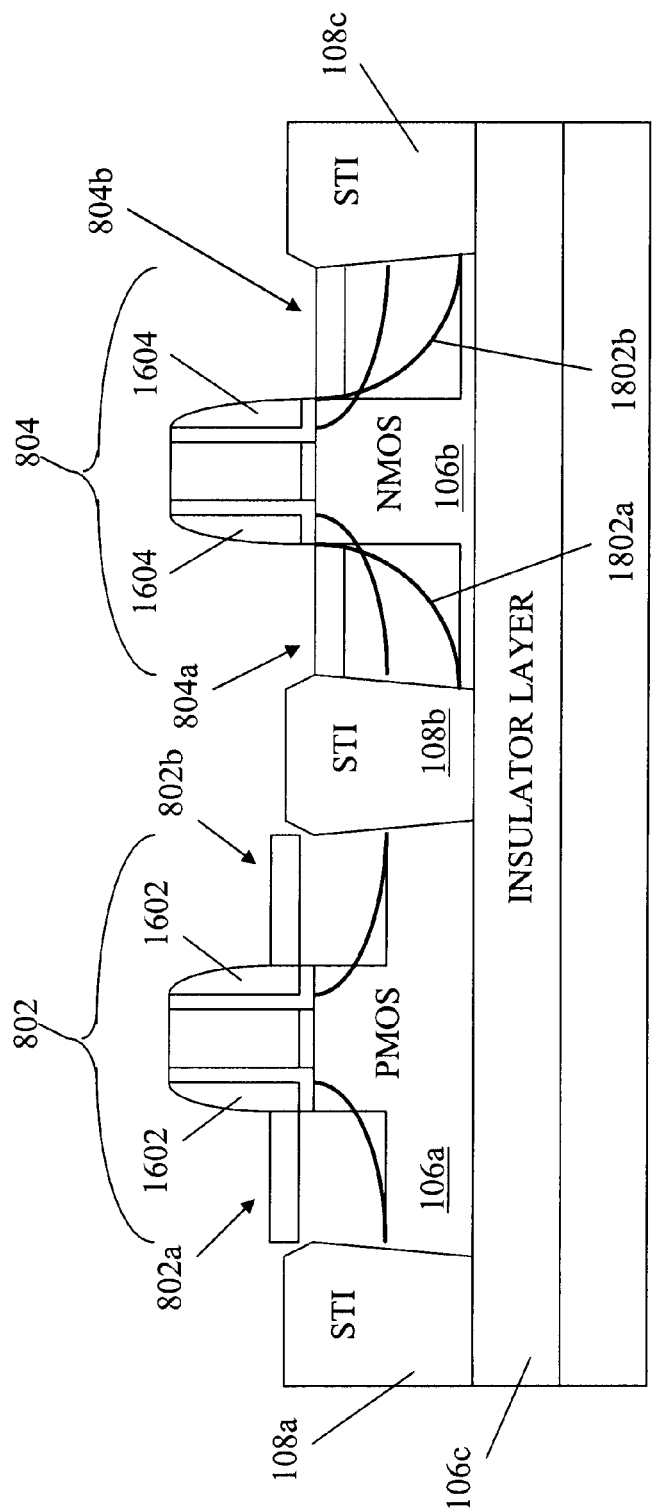
FIG. 20 is a cross sectional view illustrating an embodiment of the layer of photoresist removed from the device of FIG. 19.

Referring now to FIGS. 1*b*, 19, and 20 the method proceeds to step 1800 where a dopant 1802*a* is implanted in the source/drain region 804*a* of device 804. In an exemplary embodiment, the dopant 1802*a* is implanted in the source/drain region 804*a*, beginning offset from gate stack 104 by the spacer 1604, and ending at the shallow trench isolation structure 108*b*. A dopant 1802*b* is implanted in the source/drain region 804*b* of device 804. In an exemplary embodiment, the dopant 1802*b* is implanted in the source/drain region 804*b*, beginning offset from gate stack 104 by the spacer 1604, and ending at the shallow trench isolation structure 108*c*. In step 1900, the photoresist 1702 is removed from over device 802.

Figure 21:
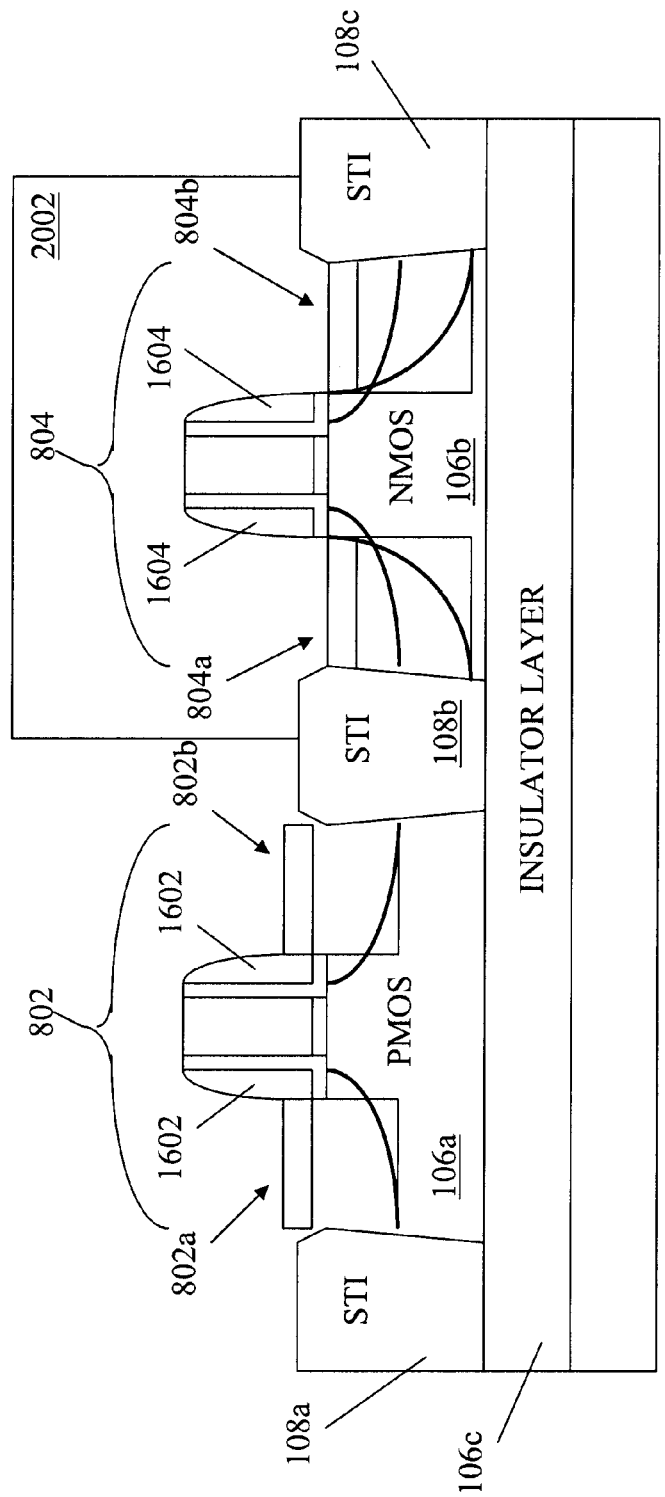
FIG. 21 is a cross sectional view illustrating an embodiment of a layer of photoresist patterned on one of the devices of FIG. 20.

Referring now to FIGS. 1*b* and 21, the method proceeds to step 2000 where a layer of photoresist 2002 is applied and patterned over the device 804. In an exemplary embodiment, the layer of photoresist 2002 is patterned such that it is situated between the shallow trench isolation structures 108*b* and 108*c* and over the device 804.

Figure 22:
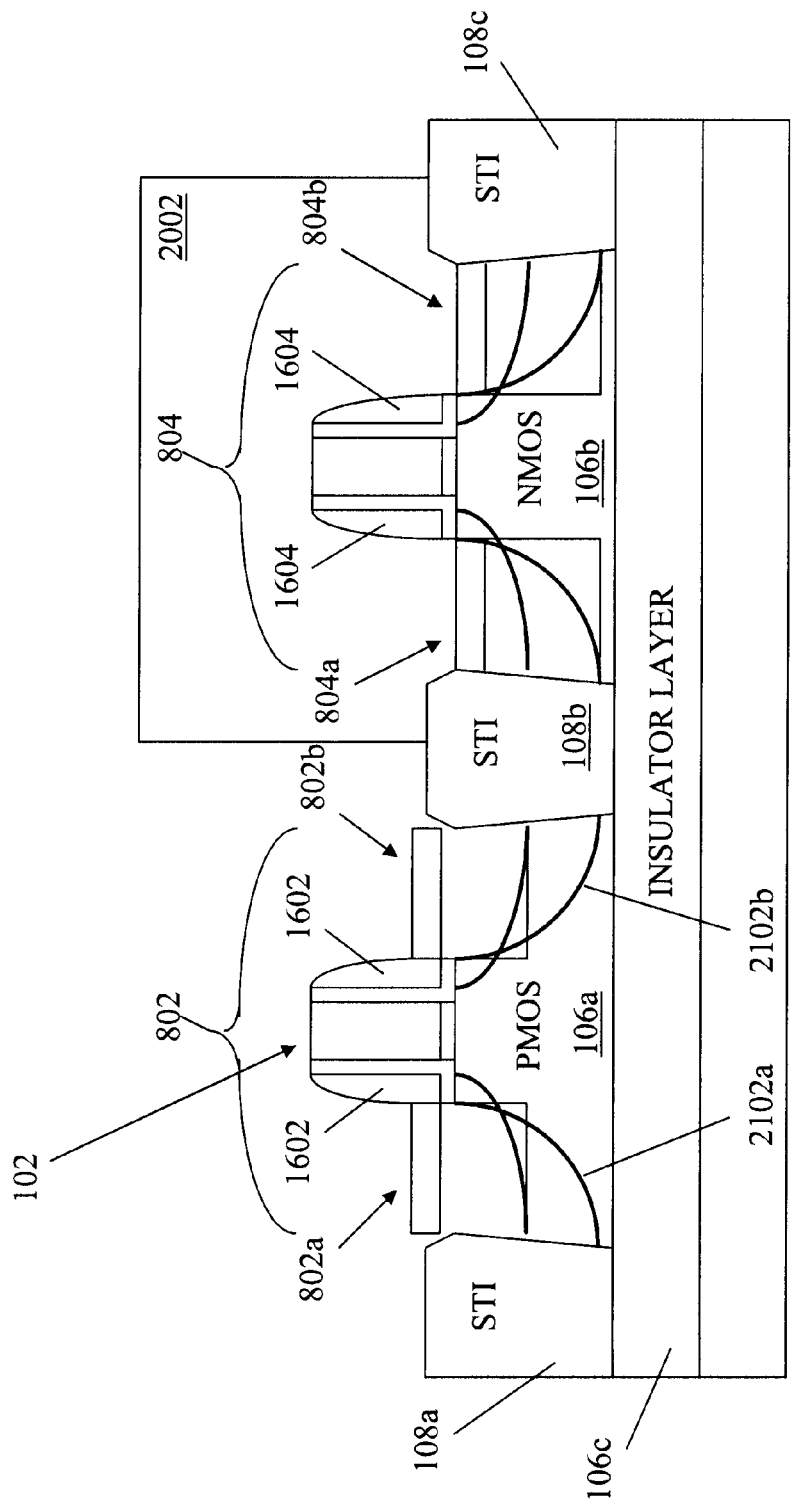
FIG. 22 is a cross sectional view illustrating an embodiment of a dopant implanted in the source/drain regions of one of the devices of FIG. 21.
Figure 23:
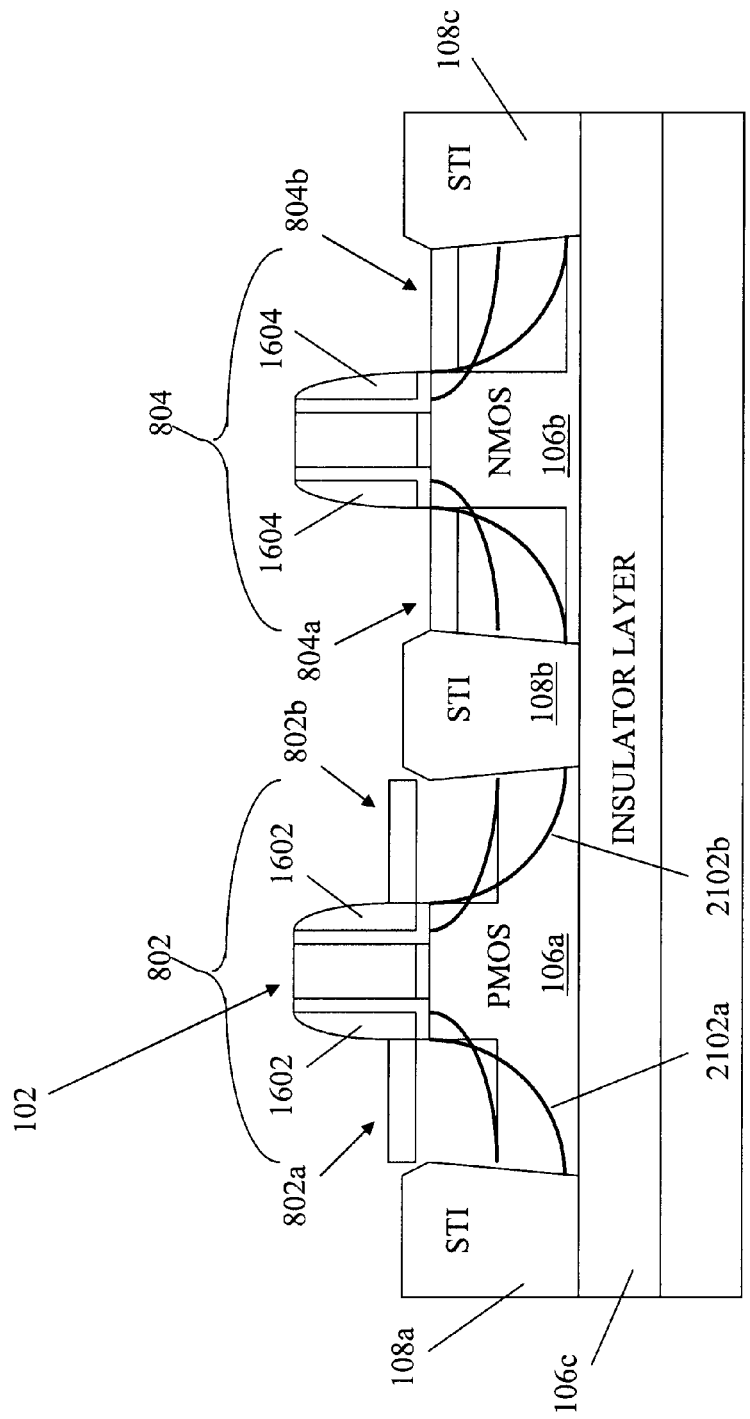
FIG. 23 is a cross sectional view illustrating an embodiment of the layer of photoresist removed from the device of FIG. 22.

Referring now to FIGS. 1*b*, 22, and 23 the method proceeds to step 2100 where a dopant 2102*a* is implanted in the source/drain region 802*a* of device 802. In an exemplary embodiment, the dopant 2102*a* is implanted in the source/drain region 802*a*, beginning offset from gate stack 102 by the spacer 1602, and ending at the shallow trench isolation structure 108*a*. A dopant 2102*b* is implanted in the source/drain region 802*b* of device 802. In an exemplary embodiment, the dopant 2102*b* is implanted in the source/drain region 802*b*, beginning offset from gate stack 102 by the spacer 1602, and ending at the shallow trench isolation structure 108*b*. In step 2200, the photoresist 2002 is removed from over device 804.

Figure 24:
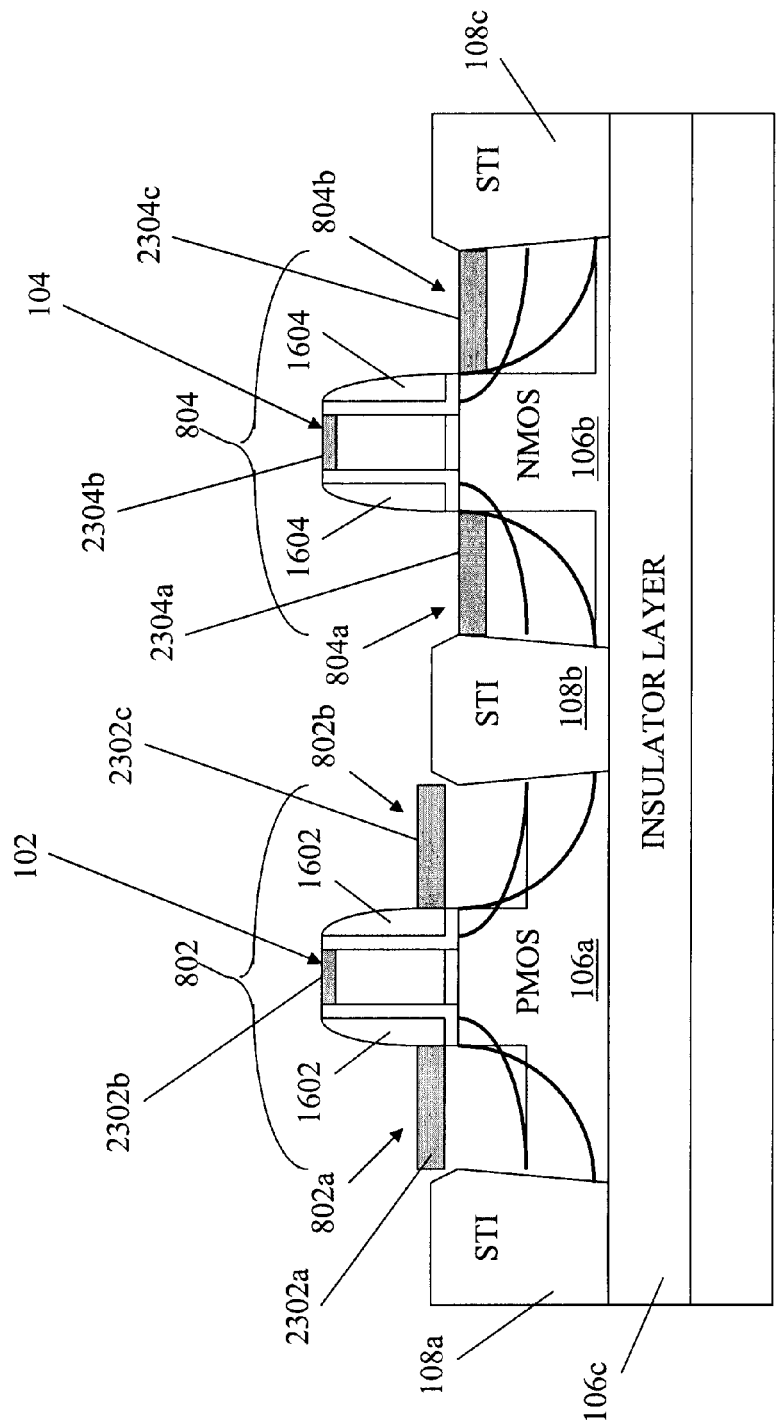
FIG. 24 is a cross sectional view illustrating an embodiment of the formation of silicide on the devices of FIG. 23.

Referring now to FIGS. 1*b* and 24, the method proceeds to step 2300 where silicide layers 2302*a*, 2302*b*, and 2302*c* are formed in device 802, with silicide layer 2302*a* formed on source/drain region 802*a*, silicide layer 2302*b* formed on gate stack 102, and silicide layer 2302*c* formed on source/drain region 802*b*. Silicide layers 2304*a*, 2304*b*, and 2304*c* are also formed in device 804, with silicide layer 2304*a* formed on source/drain region 804*a*, silicide layer 2304*b* formed on gate stack 104, and silicide layer 2304*c* formed on source/drain region 804*b*. Silicide layers 2302*a*, 2302*b*, 2302*c*, 2402*a*, 2402*b*, and 2402*c* may be formed using conventional methods known in the art.

Figure 25:
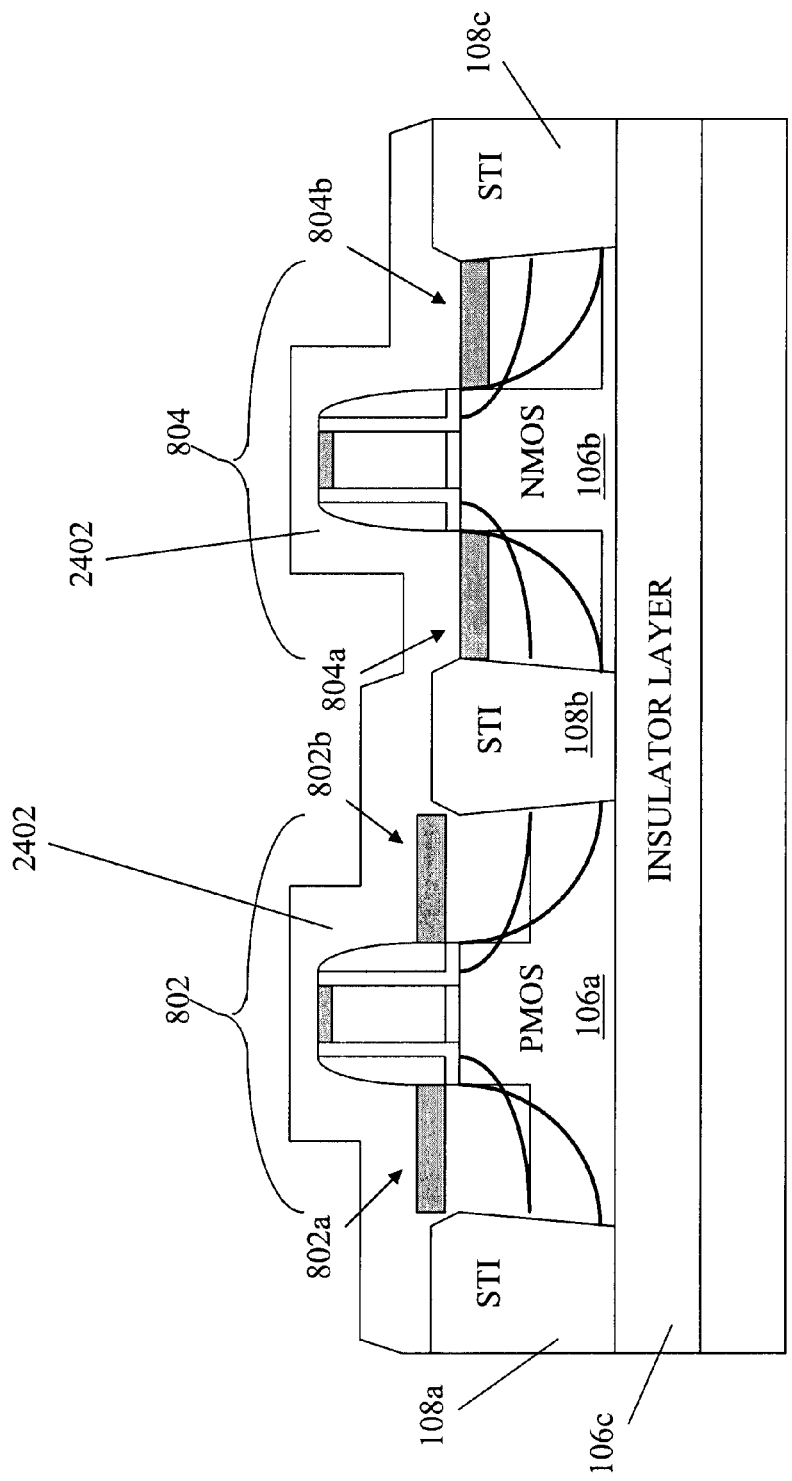
FIG. 25 is a cross sectional view illustrating an embodiment of a contact etch stop layer formed over the devices of FIG. 24.

Referring now to FIGS. 1*b* and 25, the method proceeds to step 2400 where a contact etch stop layer 2402 is deposited over the devices 802 and 804. The contact etch stop layer 2402 may be deposited using conventional methods known in the art such as chemical vapor deposition (CVD). The contact etch stop layer 2402 may comprise silicon nitride, silicon carbide, silicon dioxide, other suitable materials, or combinations thereof.

It is understood that variations may be made in the foregoing without departing from the scope of the disclosed embodiments. Furthermore, the elements and teachings of the various illustrative embodiments may be combined in whole or in part some or all of the illustrative embodiments.

Although illustrative embodiments have been shown and described, a wide range of modification, change, and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A semiconductor device comprising:
    a substrate;
    a silicon layer formed on the substrate;
    a first device situated on the substrate, the first device including a source region and a drain region each including a respective recess extending a first depth within the substrate, wherein the first depth is defined by an interface with the silicon layer, wherein the respective recesses are substantially filled with SiGe that extends to the first depth; and
    a second device situated on the substrate, the second device including a source region and a drain region each including a respective recess extending a second depth within the substrate, wherein the second depth is defined by an interface with the silicon layer, wherein the respective recesses are substantially filled with SiGe, and wherein the SiGe extends to the second depth and the second depth is not equal to the first depth.

2. The device of claim 1 wherein the substrate includes an insulator layer underlying the silicon layer.

3. The device of claim 1 wherein the first device is a PMOS device.

4. The device of claim 3 wherein the second device is an NMOS device.

5. The device of claim 4 wherein the second depth is greater than the first depth.

6. The device of claim 1 further comprising:
    a contact etch stop layer situated adjacent the first device and the second device.

7. The device of claim 1 further comprising:
a shallow trench isolation structure situated adjacent the substrate.

8. The device of claim 1 wherein the first device is a PMOS device, wherein the second device is an NMOS device, and wherein the second depth is greater than the first depth.

9. The device of claim 1 further comprising a contact etch stop layer situated adjacent the first device and the second device.

10. The device of claim 9 further comprising a shallow trench isolation structure situated adjacent the substrate.

11. The device of claim 10 wherein the substrate includes an insulator layer.

12. A semiconductor device comprising:
a substrate;
a silicon layer formed on the substrate;
a first device disposed on the substrate, the first device including a source region including a first SiGe region and a drain region including a second SiGe region, wherein the first and second SiGe regions extend to a first depth such that at the first depth there is an interface between each of the first and second SiGe regions and the silicon layer; and
a second device disposed on the substrate, the second device including a source region including a third SiGe region and a drain region including a fourth SiGe region, wherein the third and fourth SiGe regions extend to the second depth such that at the second depth there is an interface between each of the third and fourth SiGe regions and the silicon layer, and wherein the second depth is greater than the first depth.

13. The device of claim 12 wherein the substrate includes an insulator layer underlying the silicon layer.

\* \* \* \* \*